United States Patent
Im et al.

(10) Patent No.: US 11,232,973 B2
(45) Date of Patent: Jan. 25, 2022

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Dong-Hyun Im, Suwon-si (KR); Kibum Lee, Suwon-si (KR); Daehyun Kim, Suwon-si (KR); Ju Hyung We, Hwaseong-si (KR); Sungmi Yoon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/728,348

(22) Filed: Dec. 27, 2019

(65) Prior Publication Data
US 2020/0402839 A1    Dec. 24, 2020

(30) Foreign Application Priority Data
Jun. 21, 2019    (KR) .................. 10-2019-0074360

(51) Int. Cl.
| | |
|---|---|
| H01L 21/762 | (2006.01) |
| H01L 21/763 | (2006.01) |
| H01L 21/02 | (2006.01) |
| H01L 27/11556 | (2017.01) |
| H01L 27/11582 | (2017.01) |
| H01L 21/8234 | (2006.01) |
| H01L 27/108 | (2006.01) |
| H01L 27/146 | (2006.01) |
| H01L 29/78 | (2006.01) |
| H01L 21/8238 | (2006.01) |

(52) U.S. Cl.
CPC .. *H01L 21/76224* (2013.01); *H01L 21/02238* (2013.01); *H01L 21/02667* (2013.01); *H01L 21/763* (2013.01); *H01L 21/8238* (2013.01); *H01L 21/823481* (2013.01); *H01L 21/823878* (2013.01); *H01L 27/10876* (2013.01); *H01L 27/10885* (2013.01); *H01L 27/11556* (2013.01); *H01L 27/11582* (2013.01); *H01L 27/1463* (2013.01); *H01L 29/785* (2013.01); *H01L 21/02532* (2013.01); *H01L 21/02592* (2013.01)

(58) Field of Classification Search
CPC combination set(s) only.
See application file for complete search history.

(56) References Cited

U.S. PATENT DOCUMENTS

| 8,847,281 B2 | 9/2014 | Cea et al. |
| 9,799,767 B2 | 10/2017 | Jacob |

(Continued)

*Primary Examiner* — Michelle Mandala
*Assistant Examiner* — Jordan M Klein
(74) *Attorney, Agent, or Firm* — Lee IP Law, P.C.

(57) ABSTRACT

A semiconductor device and a method of fabricating a semiconductor device, the device including a semiconductor substrate that includes a trench defining an active region; a buried dielectric pattern in the trench; a silicon oxide layer between the buried dielectric pattern and an inner wall of the trench; and a polycrystalline silicon layer between the silicon oxide layer and the inner wall of the trench, wherein the polycrystalline silicon layer has a first surface in contact with the semiconductor substrate and a second surface in contact with the silicon oxide layer, and wherein the second surface includes a plurality of silicon grains that are uniformly distributed.

15 Claims, 26 Drawing Sheets

(56) References Cited

U.S. PATENT DOCUMENTS

| | | |
|---|---|---|
| 9,876,117 B2 | 1/2018 | Peng et al. |
| 2003/0054608 A1* | 3/2003 | Tseng ................ H01L 21/76224 438/257 |
| 2005/0196928 A1* | 9/2005 | Bonser .............. H01L 21/76224 438/296 |
| 2008/0185676 A1 | 8/2008 | Seo |
| 2009/0072294 A1* | 3/2009 | Yang ................. H01L 27/11521 257/321 |
| 2011/0140229 A1 | 6/2011 | Rachmady et al. |
| 2013/0164907 A1* | 6/2013 | Lee ........................ H01L 21/76 438/400 |
| 2017/0092732 A1 | 3/2017 | Yeo et al. |
| 2018/0342518 A1 | 11/2018 | Kim |
| 2019/0035893 A1 | 1/2019 | Cea et al. |
| 2019/0067122 A1 | 2/2019 | Cheng et al. |

* cited by examiner

US 11,232,973 B2

SEMICONDUCTOR DEVICE AND METHOD OF FABRICATING THE SAME

CROSS-REFERENCE TO RELATED APPLICATION

Korean Patent Application No. 10-2019-0074360, filed on Jun. 21, 2019, in the Korean Intellectual Property Office, and entitled: "Semiconductor Device and Method of Fabricating the Same," is incorporated by reference herein in its entirety.

BACKGROUND

1. Field

Embodiments relate to a semiconductor device and a method of fabricating the same, and more particularly.

2. Description of the Related Art

As the semiconductor device becomes highly integrated, the scale down of the MOSFETs is also being gradually accelerated.

SUMMARY

The embodiments may be realized by providing a semiconductor device including a semiconductor substrate that includes a trench defining an active region; a buried dielectric pattern in the trench; a silicon oxide layer between the buried dielectric pattern and an inner wall of the trench; and a polycrystalline silicon layer between the silicon oxide layer and the inner wall of the trench, wherein the polycrystalline silicon layer has a first surface in contact with the semiconductor substrate and a second surface in contact with the silicon oxide layer, and wherein the second surface includes a plurality of silicon grains that are uniformly distributed.

The embodiments may be realized by providing a semiconductor device including a semiconductor substrate that includes a trench defining an active region; a buried dielectric pattern in the trench; a silicon oxide layer between the buried dielectric pattern and an inner wall of the trench; a polycrystalline silicon layer between the silicon oxide layer and the inner wall of the trench; a conductive line that is in the semiconductor substrate and runs across the active region; a gate dielectric layer between the semiconductor substrate and the conductive line; and a plurality of impurity regions in the active region on opposite sides of the conductive line, wherein the polycrystalline silicon layer has a first surface in contact with the silicon oxide layer, and wherein the first surface includes a plurality of silicon grains that are uniformly distributed.

The embodiments may be realized by providing a method of fabricating a semiconductor device, the method including forming a trench in a semiconductor substrate such that the trench defines an active region; performing a deposition process at a first temperature range to form an amorphous silicon layer on a surface of the semiconductor substrate in which the trench is formed; performing a crystallization process on the amorphous silicon layer at a second temperature range to form a polycrystalline silicon layer, the second temperature range being different from the first temperature range; performing an oxidation process on a surface of the polycrystalline silicon layer to form a silicon oxide layer; and forming a buried dielectric pattern to fill remaining parts of the trench in which the polycrystalline silicon layer and the silicon oxide layer have been formed.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
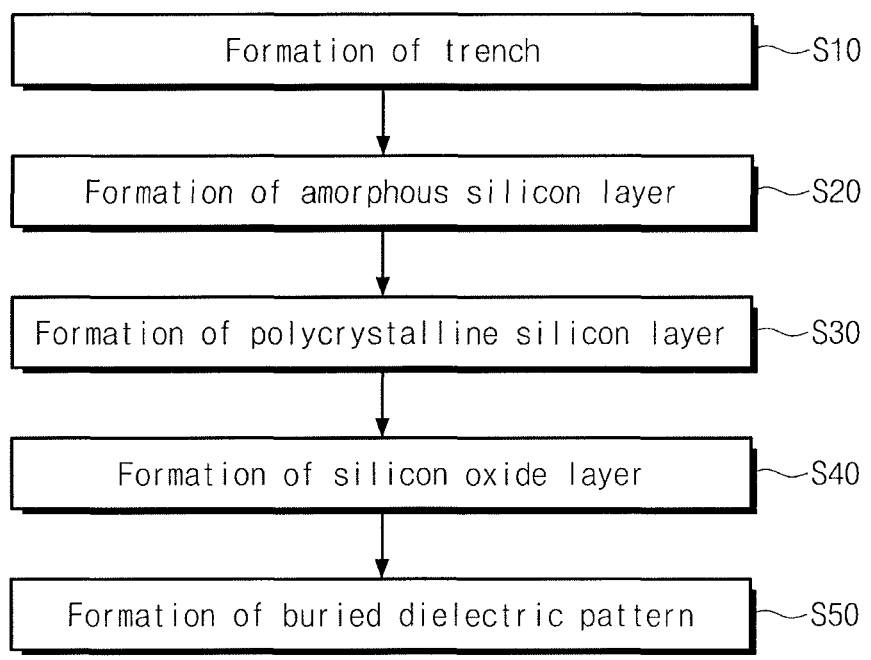
FIG. 1 illustrates a flow chart of a method of forming a thin layer of a semiconductor device according to some example embodiments.

FIG. 1 illustrates a flow chart of a method of forming a thin layer of a semiconductor device according to some example embodiments. FIGS. 2A to 2F illustrate cross-sectional views of stages in a method of forming a thin layer of a semiconductor device according to some example embodiments.

Figure 2A:
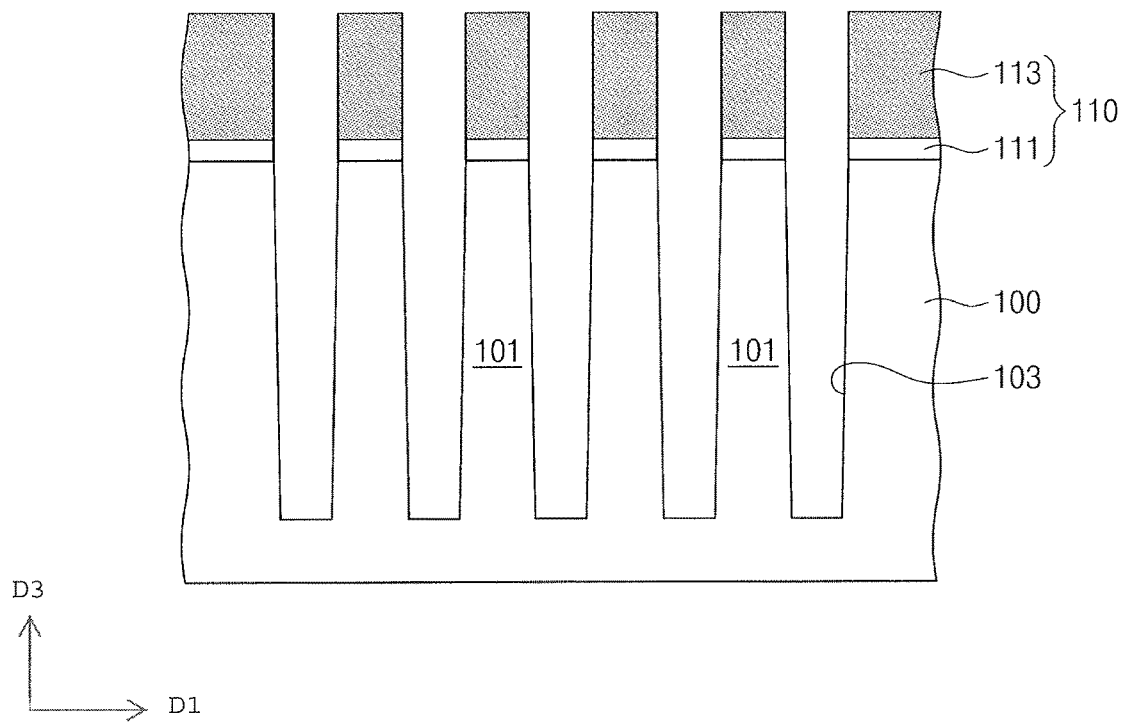
FIGS. 2A to 2F illustrate cross-sectional views of stages in a method of forming a thin layer of a semiconductor device according to some example embodiments.

Referring to FIGS. 1 and 2A, trenches 103 may be formed on or in a semiconductor substrate 100 (S10).

The semiconductor substrate 100 may be, e.g., a single crystalline silicon substrate, a silicon-on-insulator (SOI) substrate, a germanium substrate, a germanium-on-insulator (GOI) substrate, a silicon-germanium substrate, or a substrate of a thin epitaxial layer obtained by performing selective epitaxial growth (SEG).

The formation of the trenches 103 in the semiconductor substrate 100 may include forming a mask pattern 110 on the semiconductor substrate 100, and using the mask pattern 110 to etch the semiconductor substrate 100 to a certain depth.

The formation of the mask pattern 110 may include sequentially forming a buffer oxide layer 111 and a hardmask layer 113 on the semiconductor substrate 100, forming a photoresist pattern on the hardmask layer 113, using the photoresist pattern as an etching mask to sequentially anisotropically etch the hardmask layer 113 and the buffer oxide layer 111 to expose a top surface of the semiconductor substrate 100. After the mask pattern 110 is formed, the photoresist pattern may be removed. The hardmask layer 113 may have a thickness that is changed based on a depth of the trench 103 formed on the semiconductor substrate 100. The buffer oxide layer 111 may alleviate stress between the semiconductor substrate 100 and the hardmask layer 113, and may be formed by thermal oxidation on the semiconductor substrate 100.

After the mask pattern 110 is formed, the mask pattern 110 may be used as an etching mask to anisotropically etch the semiconductor substrate 100. The trench 103 formed by the anisotropic etching process may have defects, e.g. dangling bonds, on a surface thereof. For example, Si—OH bonds and/or Si—H bonds may exist on an inner wall of the trench 103.

Each trench 103 may have an upper width (e.g., in a first direction D1) that is the same as or greater than a width (e.g., in the first direction D1) of an active region 101 defined by the trench 103 (e.g., a width of the mouth of the trench 103 in the first direction D1 may be the same as or greater than the width of the active region 101 in the first direction D1). The trench 103 may have a lower width (e.g., in the first direction D1) less than the upper width thereof, or may have a substantially uniform width (e.g., the width of the mouth of the trench 103 in the first direction D1 may be the same as or greater than the width of a bottom of the trench 103 in the first direction D1). The trench 103 may have an aspect ratio of about 2:1 to 10:1 or more, and the aspect ratio of the trench 103 may increase with integration of a semiconductor device.

After the trenches 103 are formed, the mask pattern 110 may be removed to expose the top surface of the semiconductor substrate 100. In an implementation, after the trenches 103 are formed, a cleaning process may be performed to remove native oxides on the surfaces of the trenches 103. The cleaning process may include ex-situ HF dip and chemical oxide removal (COR) processes. Despite such cleaning process, a native oxide layer may randomly remain on portions of the surfaces of the trenches 103.

Figure 2B:
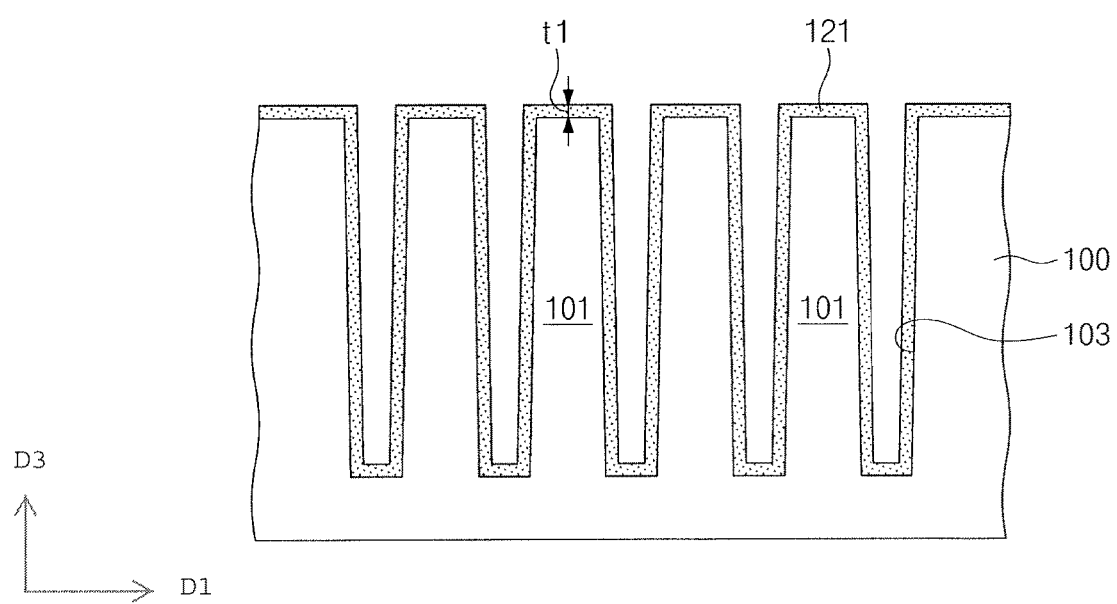

Referring to FIGS. 1 and 2B, a deposition process may be performed to form an amorphous silicon layer 121 that covers the inner walls of the trenches 103 (S20).

The amorphous silicon layer 121 may be formed by using a deposition process, e.g., chemical vapor deposition (CVD) or atomic layer deposition (ALD), with excellent step coverage.

The deposition of the amorphous silicon layer 121 may use a silicon source gas including, e.g., $SiH_4$, $Si_2H_6$, $Si_3H_8$, $SiCl_4$, $SiCl_6$, $SiCl_2H_4$, $SiCl_2H_2$ (DCS), $Si(OC_4H_9)_4$, $Si(OCH_3)_4$, $Si(OC_2H)_4$, $SiF_4$, $SiF_6$, or a combination thereof.

The amorphous silicon layer 121 may be formed by a deposition process performed at a first temperature range. In an implementation, the amorphous silicon layer 121 may be formed at a temperature lower than a crystallization temperature of silicon. In an implementation, the deposition process for the formation of the amorphous silicon layer 121 may be performed at a temperature range of, e.g., about 200° C. to 550° C. The amorphous silicon layer 121 may be deposited at a relatively low temperature, and crystallization of the amorphous silicon layer 121 may be prevented.

The amorphous silicon layer 121 may be formed by a deposition process performed at a first pressure range. In an implementation, the amorphous silicon layer 121 may be deposited in a process chamber whose pressure ranges from, e.g., about 0.01 Torr to about 300 Torr.

In an implementation, the amorphous silicon layer 121 may be deposited to a first thickness t1 of, e.g., about 5 Å to about 50 Å (e.g., as measured from the surface of the trench or the semiconductor substrate 100), and the inner walls of the trenches 103 may be covered with the amorphous silicon layer 121 having a uniform thickness. For example, the amorphous silicon layer 121 may have substantially the same thickness on a bottom surface and a sidewall of the trench 103. The amorphous silicon layer 121 deposited on the surface of the trench 103 may include silicon grains that are crystallized on a portion of the surface of the trench 103.

Figure 2C:
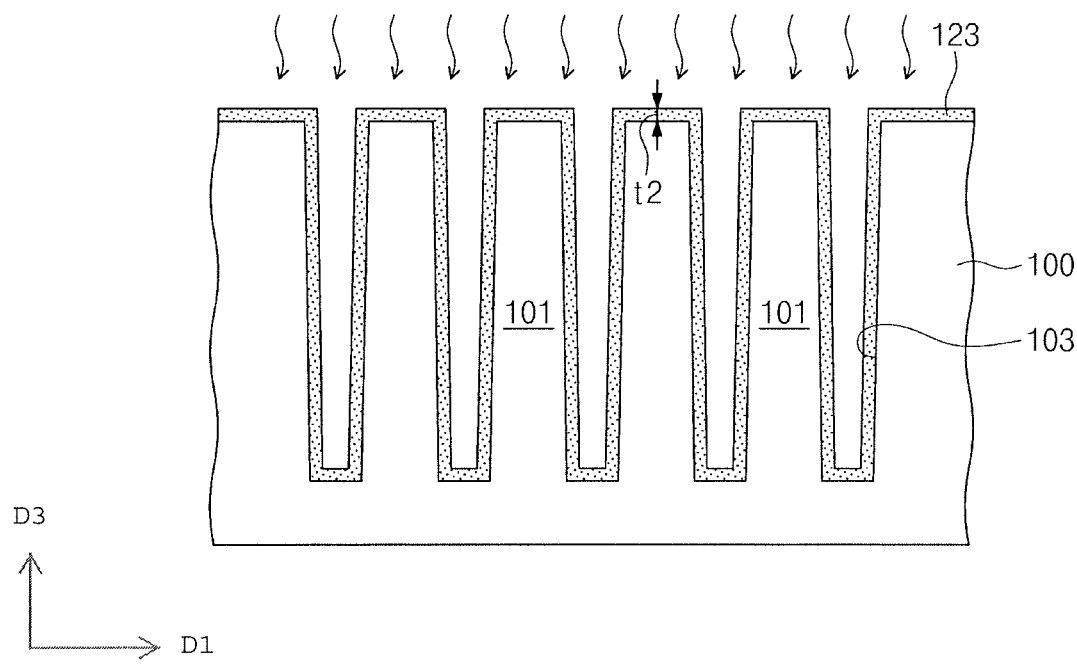

Referring to FIGS. 1 and 2C, the amorphous silicon layer 121 may undergo a crystallization process to form a polycrystalline silicon layer 123 (S30).

The crystallization process may include a rapid thermal annealing process. The crystallization process may include an annealing process performed at a second temperature range. The second temperature range may be higher than the first temperature range at which the amorphous silicon layer 121 is deposited. In an implementation, the crystallization process may be performed at a temperature range of, e.g., about 550° C. to about 800° C. During the crystallization process, a process chamber may have a pressure of, e.g., about 0.01 Torr to about 300 Torr. The annealing process for forming the polycrystalline silicon layer 123 may use a process gas including, e.g., one or more of $N_2$, Ar, $H_2$, and $O_2$.

The crystallization process may be performed such that the amorphous silicon layer 121 has silicon grains therein that are crystallized from a surface of a single crystalline silicon substrate (or the semiconductor substrate 100). The crystallization process may continue until crystallization is fully achieved from the surface of the trench 103 to a surface of the amorphous silicon layer 121 (e.g., a surface opposite to that which faces the trench 103). In an implementation, the crystallization process may cause silicon grains of the polycrystalline silicon layer 123 to contact a single crystalline silicon substrate (or the semiconductor substrate 100), and silicon grains may be uniformly distributed on a surface of the polycrystalline silicon layer 123. The polycrystalline silicon layer 123 may have a second thickness t2 of, e.g., about 5 Å to about 50 Å.

In an implementation, during the crystallization process, an element for preventing migration of grain may be provided on the surface of the amorphous silicon layer 121. For example, silicon grains may be prevented from growing non-uniformly, which could otherwise occur due to their migration in the amorphous silicon layer 121. For example, during the crystallization process, an extremely small amount of $H_2O$, $O_2$, $O_3$, or oxygen radicals may be provided onto the surface of the amorphous silicon layer 121. In an implementation, the amorphous silicon layer 121 may be annealed under an oxygen plasma atmosphere, and oxygen radicals may be generated and adsorbed on the surface of the amorphous silicon layer 121.

An extremely small amount of oxygen radicals may be provided to the amorphous silicon layer 121 during its crystallization, and radicals adsorbed on the surface of the amorphous silicon layer 121 may help prevent silicon particles from migration and local non-uniform growth when an annealing process is performed at high temperature.

Figure 2D:
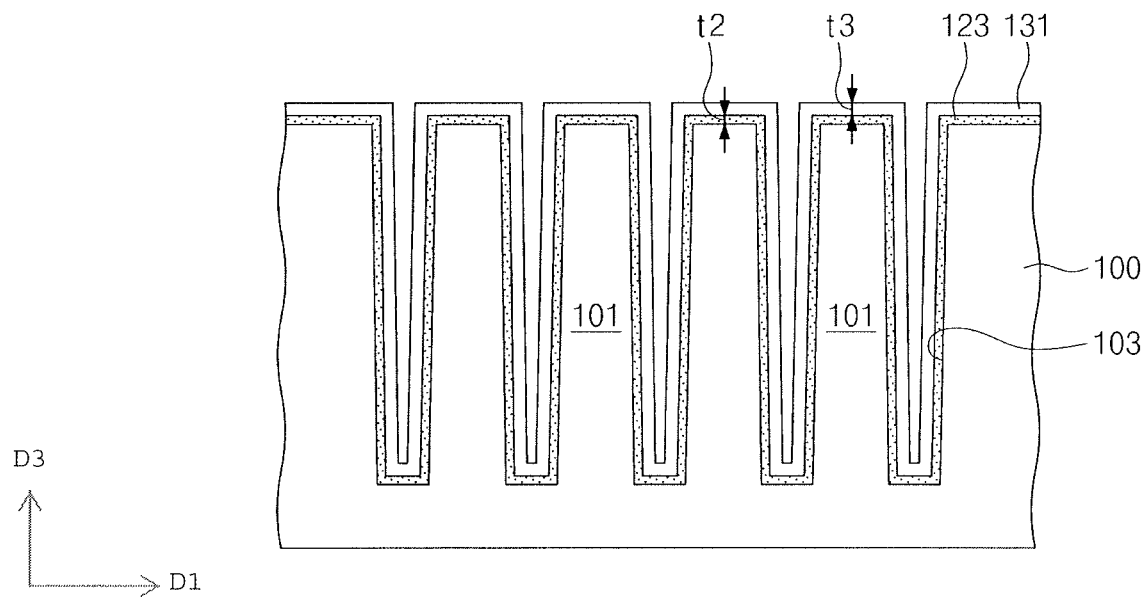

Referring to FIGS. 1 and 2D, the polycrystalline silicon layer 123 may undergo an oxidation process to form a silicon oxide layer 131 (S40).

The formation of the silicon oxide layer 131 may use, e.g., an atomic deposition process, a dry oxidation process, a wet oxidation process, a radical oxidation process, or a plasma oxidation process.

The oxidation process may include an annealing process performed under a gas atmosphere including oxygen atoms. The oxidation process may be performed at a temperature ranging from, e.g., about 600° C. to about 1,100° C., and at a pressure ranging from, e.g., about 0.01 Torr to about 50 Torr. When the oxidation process is performed, oxygen atoms may react with silicon atoms of the polycrystalline silicon layer 123 to form the silicon oxide layer 131 on the polycrystalline silicon layer 123. When the oxidation process is performed, silicon of the polycrystalline silicon layer 123 may be consumed to form the silicon oxide layer 131.

For example, after the silicon oxide layer 131 is formed, the polycrystalline silicon layer 123 may decrease in thickness. In an implementation, the silicon oxide layer 131 may have a thickness greater than that of the polycrystalline silicon layer 123 (e.g., when measured in a same direction). In an implementation, the second thickness t2 of the polycrystalline silicon layer 123 may range from, e.g., about 5 Å to about 45 Å. In an implementation, the silicon oxide layer 131 may have a third thickness t3 of, e.g., about 10 Å to about 90 Å.

A radical oxidation process may be performed as the oxidation process. The radical oxidation process may be executed in such a way that an oxygen source gas is activated into a radical state to produce an oxidation reaction with silicon. The radical oxidation process using oxygen radicals may have a fast reaction rate of the oxygen radicals, and the silicon oxide layer 131 with a small thickness may be formed in a short time.

In an implementation, an in-situ steam generation (ISSG) process may be performed as the oxidation process. The ISSG process may be performed under an atmosphere including vapor ($H_2O$), an oxygen radical ($O_2^-$), and a hydroxyl group ($OH^-$), which atmosphere may be created by supplying hydrogen and oxygen. A source gas of the oxidation process may use $O_2$ gas, $H_2O$ gas (or steam), a mixed gas of $H_2$ and $O_2$, or a mixed gas of $H_2$, $Cl_2$, and $O_2$.

In an implementation, the silicon oxide layer 131 may be formed on the polycrystalline silicon layer 123 whose surface is uniform, and the polycrystalline silicon layer 123 and the silicon oxide layer 131 may have an interface therebetween with improved properties.

After the silicon oxide layer 131 is formed, the polycrystalline silicon layer 123 may have a first interface in contact with a single crystalline silicon substrate (or the semiconductor substrate 100) and a second interface in contact with the silicon oxide layer 131. The second interface may have a surface roughness substantially the same as that of the first interface. The second interface of the polycrystalline silicon layer 123 may include uniformly distributed silicon grains, and may have a surface roughness of, e.g., about 0.1 Å to about 10 Å.

Figure 2E:
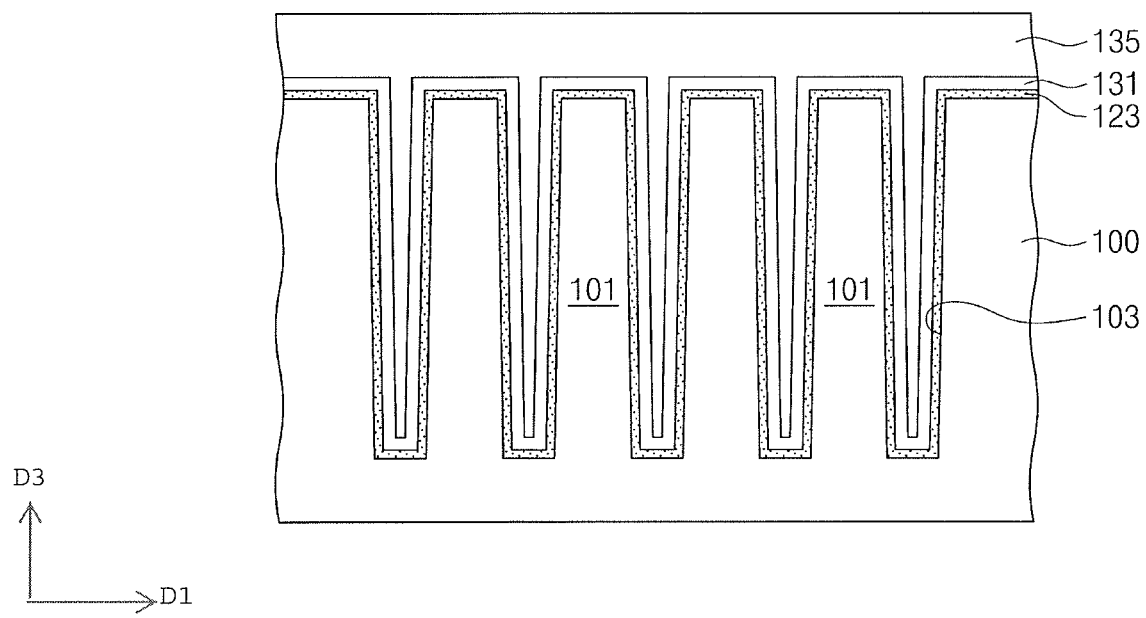

Referring to FIG. 2E, a buried dielectric layer 135 may be formed to fill (e.g., remaining portions of) the trench 103 (S50).

The buried dielectric layer 135 may be formed by a solution process using a flowable material that is relatively easy to gap-fill. In an implementation, the buried dielectric layer 135 may be a Tonen Silazene (TOSZ) oxide layer. The formation of the buried dielectric layer 135 may include supplying a Tonen Silazene (TOSZ) material on a substrate, and then baking the Tonen Silazene (TOSZ) material.

In an implementation, the buried dielectric layer 135 may include high density plasma (HDP) oxide, TEOS (tetraethylorthosilicate), PE-TEOS (plasma enhanced tetraethylorthosilicate), $O_3$-TEOS ($O_3$-tetratthylorthosilicate), USG (undoped silicate glass), PSG (phosphosilicate glass), BSG (borosilicate glass), BPSG (borophosphosilicate glass), FSG (fluorosilicate glass), SOG (spin on glass), or a combination thereof.

In an implementation, before the buried dielectric layer 135 is formed, a silicon nitride layer may be formed on a surface of the silicon oxide layer 131. The silicon nitride layer may help prevent a thickness of the silicon oxide layer 131 from being enlarged between the polycrystalline silicon layer 123 and the buried dielectric layer 135 that fills the remaining part of the trench 103. In addition, the silicon nitride layer may help reduce stress, which could otherwise occur on the inner wall of the trench 103 due to volume expansion of the buried dielectric layer 135 that fills the trench 103.

Figure 2F:
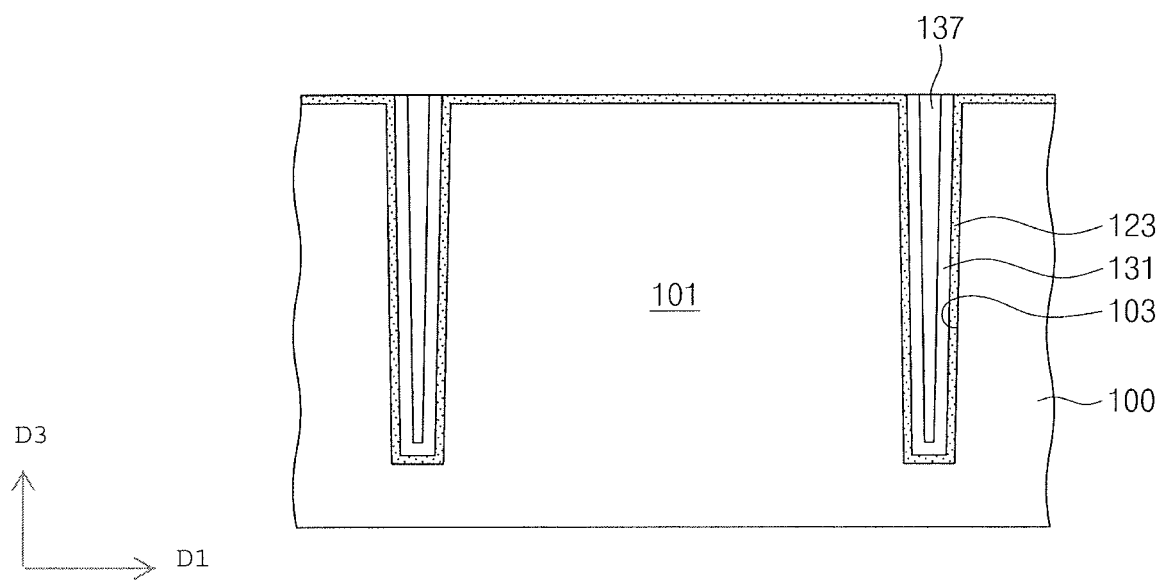

Referring to FIG. 2F, a planarization process may be performed to expose the polycrystalline silicon layer 123 or the silicon nitride layer. For example, a buried dielectric pattern 137 may be formed in the trench 103. The planarization process may use a chemical mechanical polishing (CMP) process and/or an etch-back process. The polycrystalline silicon layer 123 and the silicon nitride layer may thus be partially removed.

For example, the planarization process may expose the polycrystalline silicon layer 123 that covers the top surface of the semiconductor substrate 100 (e.g., between the mouths of the trenches 103). The polycrystalline silicon layer 123 may have a smaller thickness on the top surface of the semiconductor substrate 100 and a larger thickness on the inner wall of the trench 103. In an implementation, the planarization process may remove the polycrystalline silicon layer 123 that covers the top surface of the semiconductor substrate 100, and may expose the top surface of the semiconductor substrate 100.

Figure 3A:
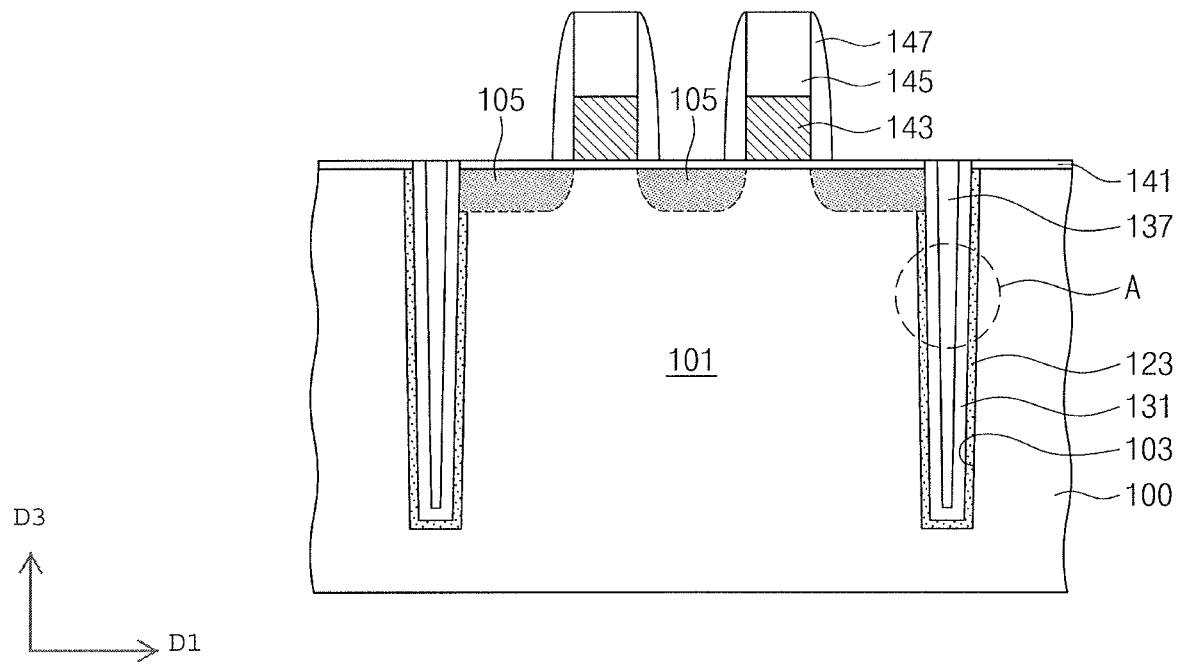
FIGS. 3A and 3B illustrate cross-sectional views of a semiconductor device according to some example embodiments.
Figure 3B:
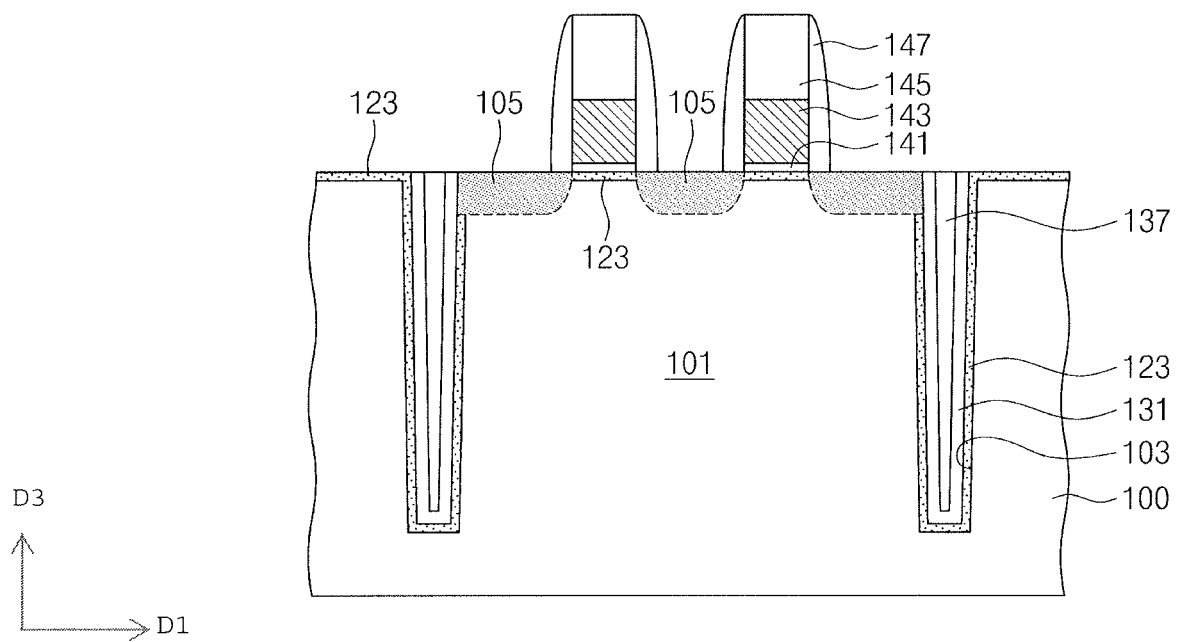
Figure 4A:
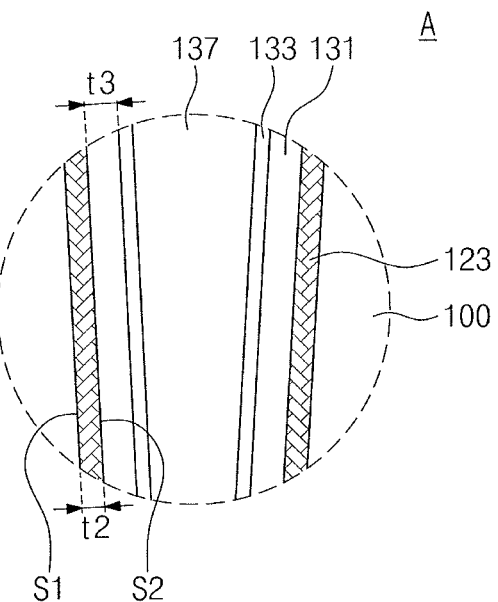
FIGS. 4A and 4B illustrate enlarged views showing section A of FIG. 3A.
Figure 4B:
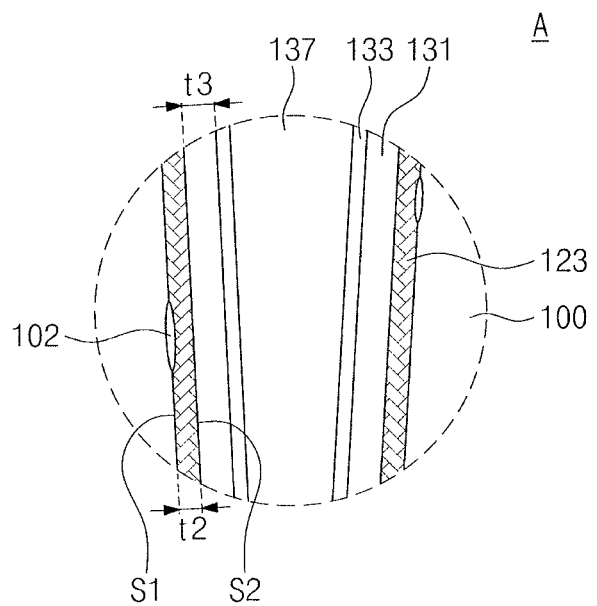

FIGS. 3A and 3B illustrate cross-sectional views of a semiconductor device according to some example embodiments. FIGS. 4A and 4B illustrate enlarged views showing section A of FIG. 3A.

Referring to FIG. 3A, a semiconductor substrate 100 may be provided thereon with a device isolation structure that is in a trench 103 that defines an active region 101. For example, the active region 101 may have a width (e.g., in the first direction D1) less than a width of the trench 103 (e.g., in the first direction D1), which trench 103 may have an aspect ratio of about 2:1 to 10:1 or more.

The device isolation structure may include a polycrystalline silicon layer 123, a silicon oxide layer 131, a silicon nitride layer 133, and a buried dielectric pattern 137. The polycrystalline silicon layer 123 may be in direct contact with an inner wall of the trench 103 of the semiconductor substrate 100. For example, the polycrystalline silicon layer 123 may be in direct contact with a single crystalline silicon substrate, or with the semiconductor substrate 100. The polycrystalline silicon layer 123 may extend from or along a sidewall of the trench 103 toward (e.g., or onto) a top surface of the semiconductor substrate 100.

Referring to FIGS. 3A and 4A, the silicon oxide layer 131 may have a thickness t3 greater than a thickness t2 of the polycrystalline silicon layer 123 (e.g., when measured in the same direction). The polycrystalline silicon layer 123 may have a first surface S1 in contact with the inner wall of the trench 103 and a second surface S2 in contact with the silicon oxide layer 131. On the first surface S1 of the polycrystalline silicon layer 123, silicon grains may be in direct contact with the inner wall of the trench 103, or with the semiconductor substrate 100. On the second surface S2 of the polycrystalline silicon layer 123, silicon grains may be in direct contact with the silicon oxide layer 131. In an implementation, the second surface S2 may include silicon grains that are uniformly distributed, and may have a surface roughness of, e.g., about 0.1 Å to about 10 Å. In an implementation, the first surface S1 may have a surface roughness substantially the same as that of the second surface S2.

In an implementation, referring to FIG. 4B, a native oxide layer 102 may be locally present (e.g., discontinuously present in an island arrangement) between the first surface S1 of the polycrystalline silicon layer 123 and the inner wall of the trench 103. The polycrystalline silicon layer 123 may cover the native oxide layer 102. The second surface S2 of the polycrystalline silicon layer 123 may have uniform silicon grains on both the inner wall of the trench 103 and the native oxide layer 102.

Referring back to FIG. 3A, a gate dielectric layer 141 may be on the top surface of the semiconductor substrate 100, and any of the polycrystalline silicon layer 123 on the top surface of the semiconductor substrate 100 may be oxidized when the gate dielectric layer 141 is formed. For example, on the top surface of the semiconductor substrate 100, the polycrystalline silicon layer 123 may be oxidized into the gate dielectric layer 141.

A gate structure may be on the active region 101 of the semiconductor substrate 100. The gate structure may include a gate conductive pattern 143 on the gate dielectric layer 141 and a gate mask pattern 145 on the gate conductive pattern 143. A gate spacer 147 may be on opposite sidewalls of the gate structure. The gate dielectric layer 141 may be formed of one of a thermal oxide layer, a silicon oxide layer, a silicon oxynitride layer, and a high-k dielectric layer. The gate conductive pattern 143 may include one or more of a polysilicon layer, a metal layer, a metal nitride layer, and a metal silicide layer. The gate mask pattern 145 and the gate spacer 147 may include a silicon oxide layer, a silicon oxynitride layer, or a combination thereof.

Source/drain impurity regions 105 may be in the active region 101 on or at opposite sides of the gate structure. The source/drain impurity regions 105 may be formed by implanting the semiconductor substrate 100 with impurities whose conductivity type is opposite to that of the semiconductor substrate 100.

In an implementation, referring to FIG. 3B, the polycrystalline silicon layer 123 and the silicon oxide layer 131 (the gate dielectric layer 141) may be between the gate conductive pattern 143 and the semiconductor substrate 100 (e.g., in a vertical direction D3). The silicon oxide layer 131 may be used as the gate dielectric layer 141. The polycrystalline silicon layer 123 may include uniform silicon grains on a surface thereof, and a leakage current may be prevented from occurring at an interface between the gate dielectric layer 141 and the polycrystalline silicon layer 123.

The polycrystalline silicon layer 123 may have a first thickness on the sidewall of the trench 103 and a second thickness, which is different from the first thickness, on the top surface of the semiconductor substrate 100.

Figure 5:
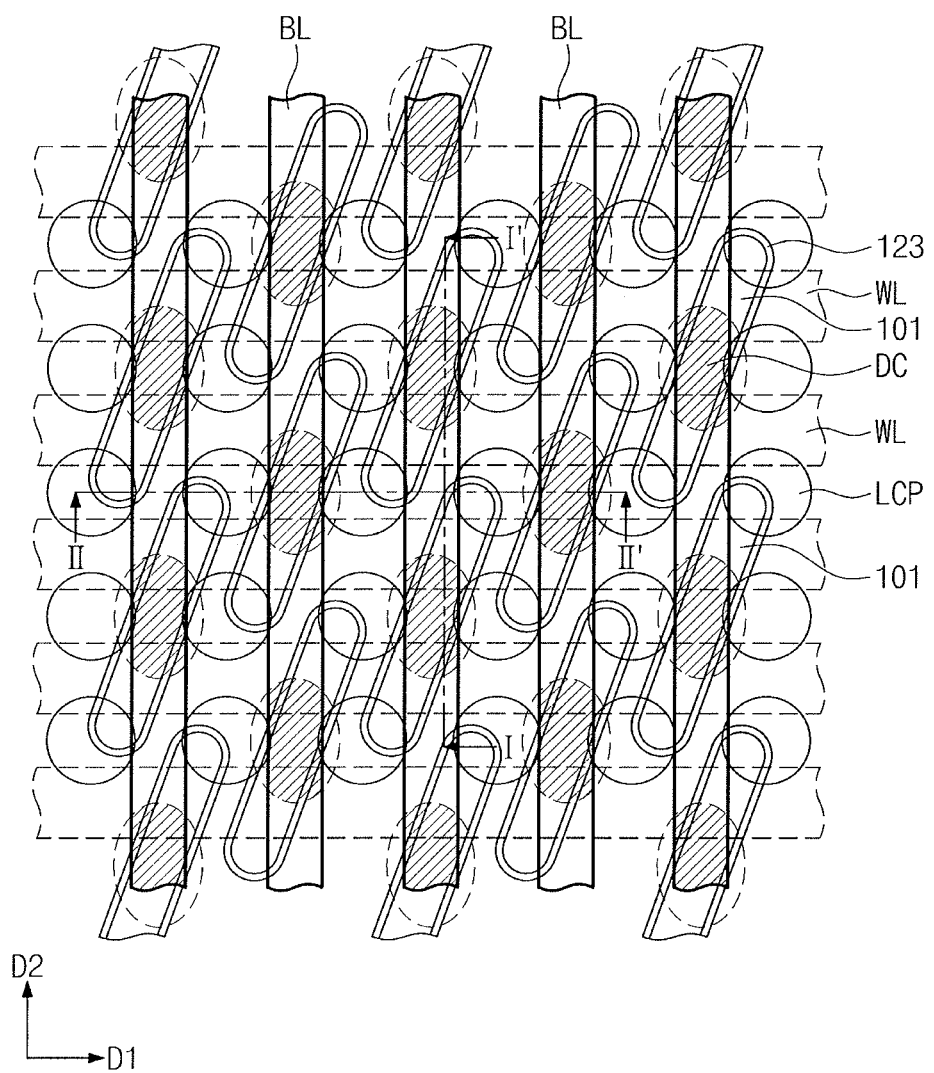
FIG. 5 illustrates a plan view of a semiconductor device according to some example embodiments.

FIG. 5 illustrates a plan view of a semiconductor device according to some example embodiments. FIGS. 6A to 6I illustrate cross-sectional views taken along lines I-I' and II-II' of FIG. 5, of stages in a method of fabricating a semiconductor device according to some example embodiments. For brevity of description, omissions may be made to avoid repetitive explanation of the same technical feature as that of the method of forming a thin layer of a semiconductor device, which method has been discussed with reference to FIGS. 1 and 2A to 2F.

Figure 6A:
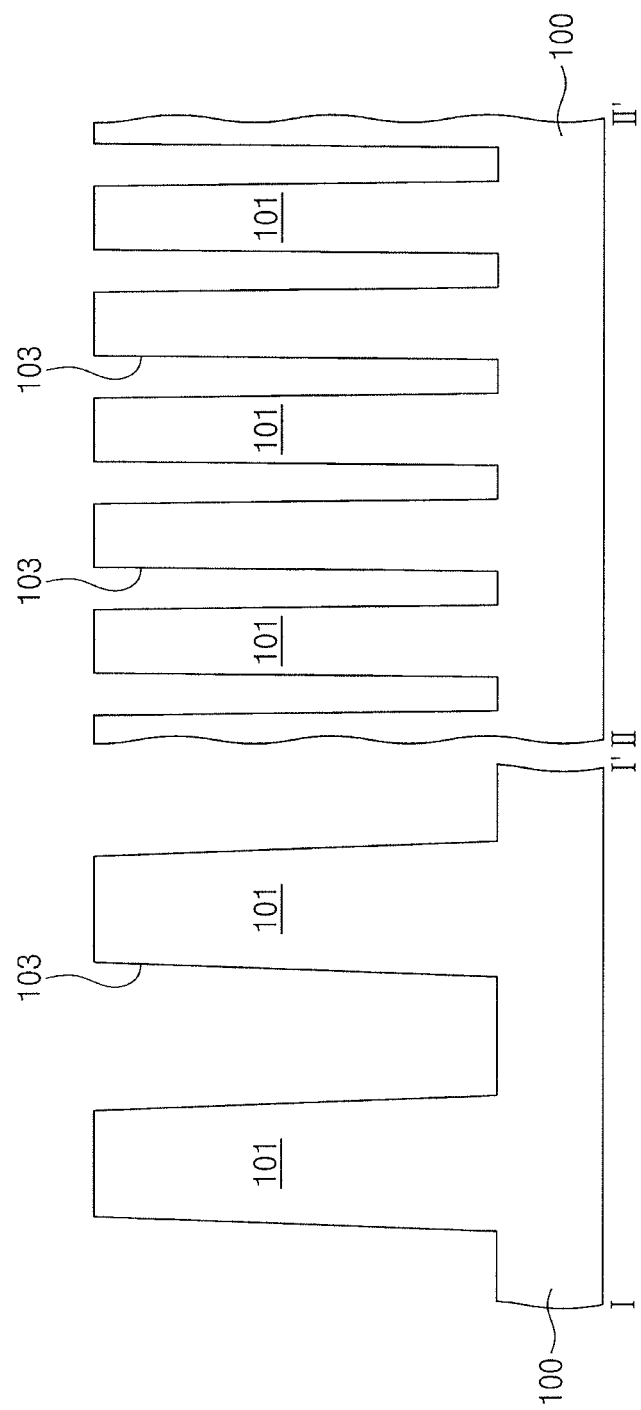
FIGS. 6A to 6I illustrate cross-sectional views taken along lines I-I' and II-II' of FIG. 5, of stages in a method of fabricating a semiconductor device according to some example embodiments.

Referring to FIGS. 5 and 6A, a trench 103 may be formed to define active regions 101 on or in a semiconductor substrate 100. The semiconductor substrate 100 may be a silicon substrate, a germanium substrate, a silicon-germanium substrate, or the like.

The trench 103 may be formed, as discussed above, by forming a mask pattern on the semiconductor substrate 100 and using the mask pattern as an etching mask to anisotropically etch the semiconductor substrate 100.

The active regions 101 may each have a rectangular (or bar) shape, and may be two-dimensionally arranged along the first direction D1 and a second direction D2 that intersects (e.g., perpendicularly to) the first direction D1. When viewed in plan, the active regions 101 may be arranged in a zigzag shape, and may have a major axis in an oblique direction relative to the first and second directions D1 and D2. For example, each of the active regions 101 may have a minor axial width of about 1 nm to about 50 nm.

Figure 6B:
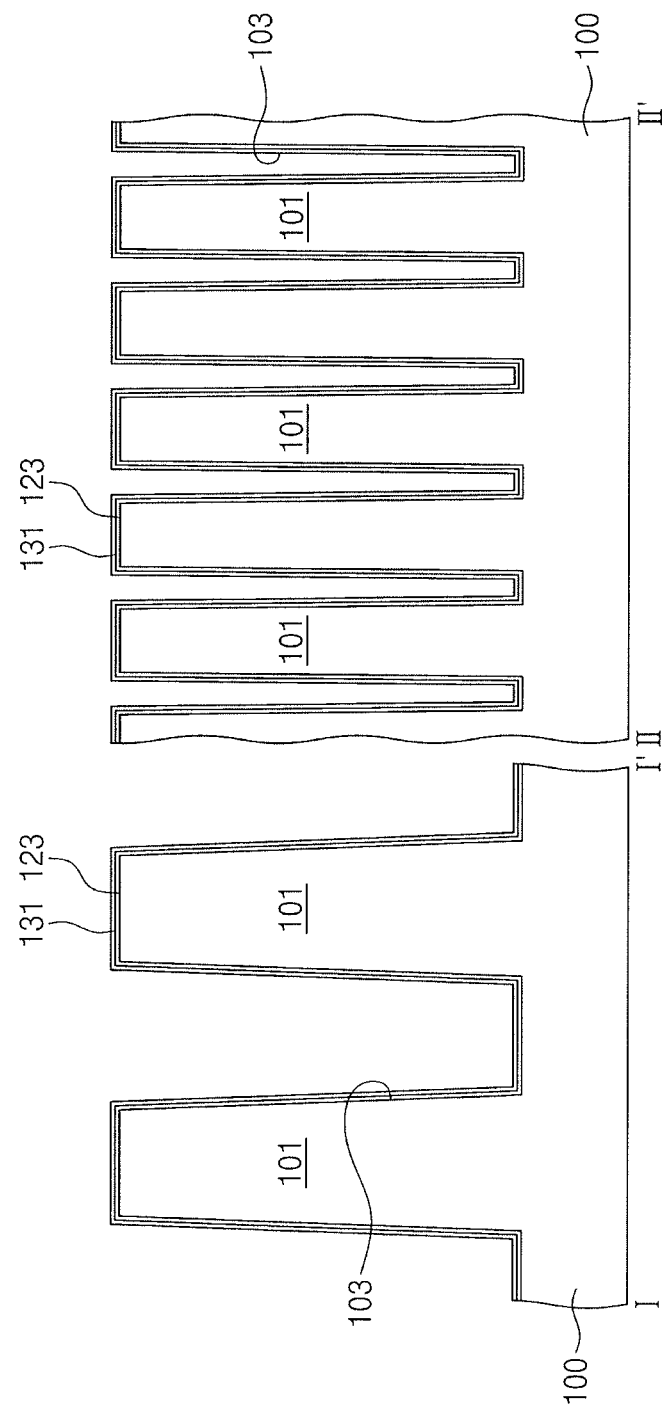

Referring to FIGS. 5 and 6B, as mentioned above, a polycrystalline silicon layer 123 and a silicon oxide layer 131 may be sequentially formed on a surface of the semiconductor substrate 100 in which the trench 103 is formed. As discussed above with reference to FIGS. 2A to 2D, the formation of the polycrystalline silicon layer 123 may include depositing an amorphous silicon layer on a surface of the trench 103 and crystallizing the amorphous silicon layer into the polycrystalline silicon layer 123. The polycrystalline silicon layer 123 may then have a surface on which silicon grains are uniformly distributed.

The silicon oxide layer 131 may be formed by performing an oxidation process on a surface of the polycrystalline silicon layer 123. The oxidation process for forming the silicon oxide layer 131 may be performed in-situ with the crystallization process. The silicon oxide layer 131 may be formed by oxidizing the uniform surface of the polycrystalline silicon layer 123, and a uniform interface may be formed between the silicon oxide layer 131 and the polycrystalline silicon layer 123. In an implementation, the interface between the silicon oxide layer 131 and the polycrystalline silicon layer 123 may have a surface roughness of about 0.1 Å to about 10 Å.

Figure 6C:
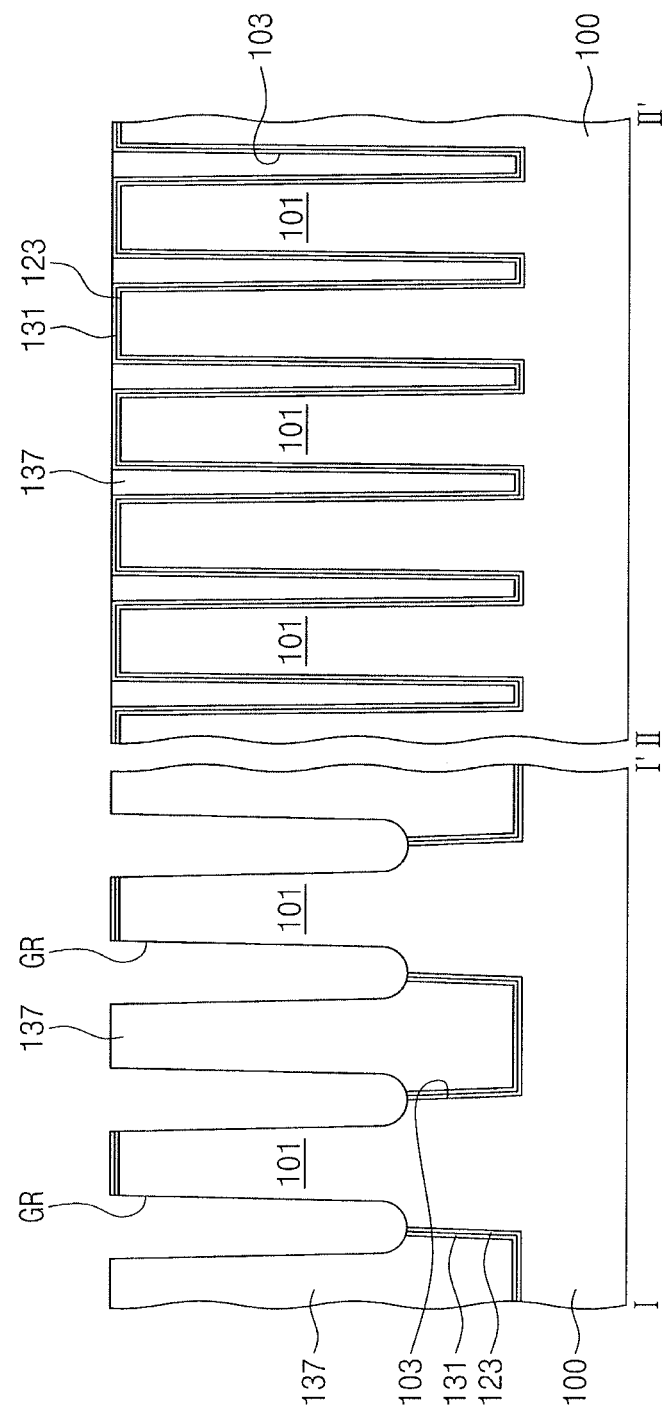

Referring to FIGS. 5 and 6C, a buried dielectric pattern 137 may be formed to fill the (e.g., remaining parts of the) trench 103 accommodating the polycrystalline silicon layer 123 and the silicon oxide layer 131. For example, the trench 103 may have therein a device isolation structure that includes the polycrystalline silicon layer 123, the silicon oxide layer 131, and the buried dielectric pattern 137.

As described previously, the formation of the buried dielectric pattern 137 may include depositing on the semiconductor substrate 100 a buried dielectric layer to fill the trench 103 accommodating the polycrystalline silicon layer 123 and the silicon oxide layer 131, and then performing a planarization process to expose the silicon oxide layer 131 or the polycrystalline silicon layer 123. The planarization process may use a chemical mechanical polishing (CMP) process and/or an etch-back process. When the planarization process is performed, the silicon oxide layer 131 and the polycrystalline silicon layer 123 may be partially removed to expose a top surface of the semiconductor substrate 100.

The active regions 101 and the device isolation structure may be patterned to form gate recess regions GR that extend in the first direction D1.

The formation of the gate recess regions GR may include forming mask patterns that extend in the first direction D1 on the semiconductor substrate 100 to run across the active regions 101, and performing an anisotropic etching process in which the mask patterns are used as an etching mask to anisotropically etch the semiconductor substrate 100. The anisotropic etching process may partially etch the device isolation structure and the active regions 101. The trench 103 may have thereunder a portion of the polycrystalline silicon layer 123 and a portion of the silicon oxide layer 131.

Figure 6D:
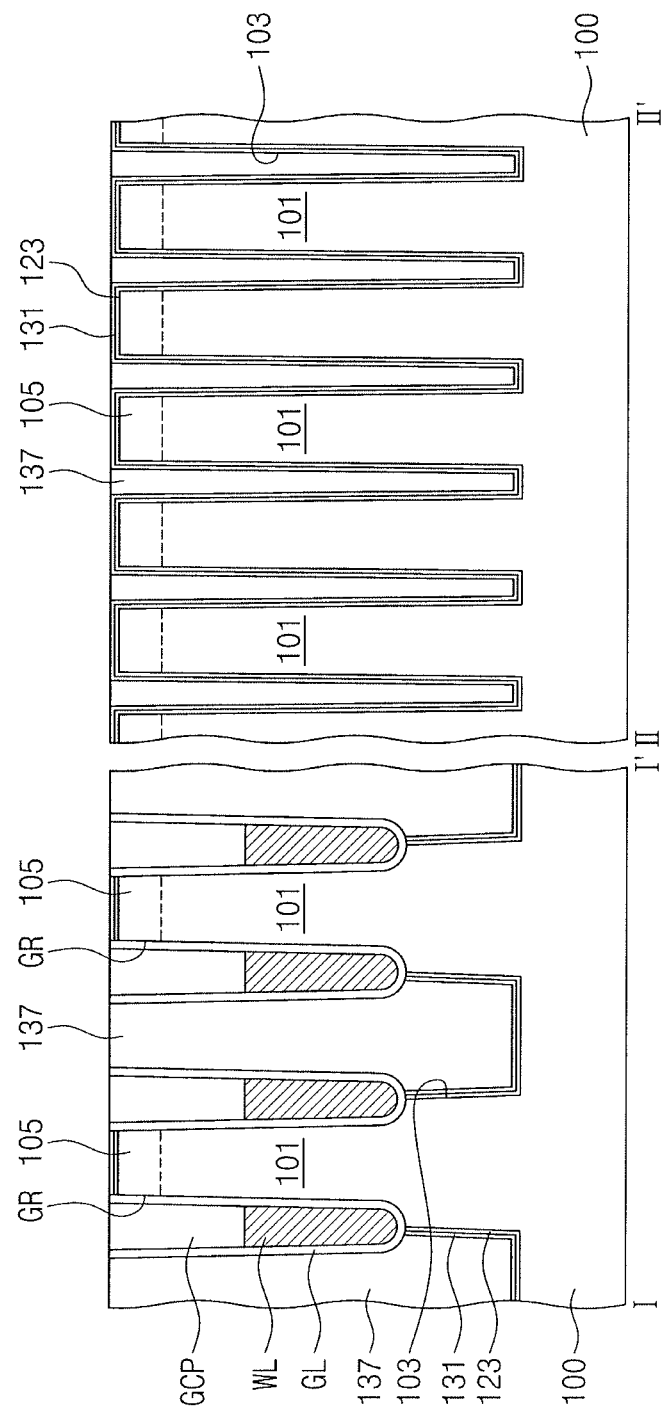

Referring to FIGS. 5 and 6D, after the gate recess regions GR are formed, word lines WL may be formed in the gate recess regions GR in which gate dielectric layers GL are formed. The gate recess regions GR may have bottom surfaces higher than bottom surfaces of the device isolation structure (e.g., bottoms of the trenches 103). The word lines WL may have their top surfaces lower than top surfaces of the device isolation structure (e.g., mouths of the trenches 103). Gate hardmask patterns GCP may be formed in the gate recess regions GR in which the word lines WL are formed.

After the word lines WL are formed, source/drain impurity regions 105 may be formed in the active region 101 on opposite sides of the word line WL. The source/drain impurity regions 105 may be formed by performing an ion implantation process, and may have a conductivity type opposite to that of the active regions 101.

Figure 6E:
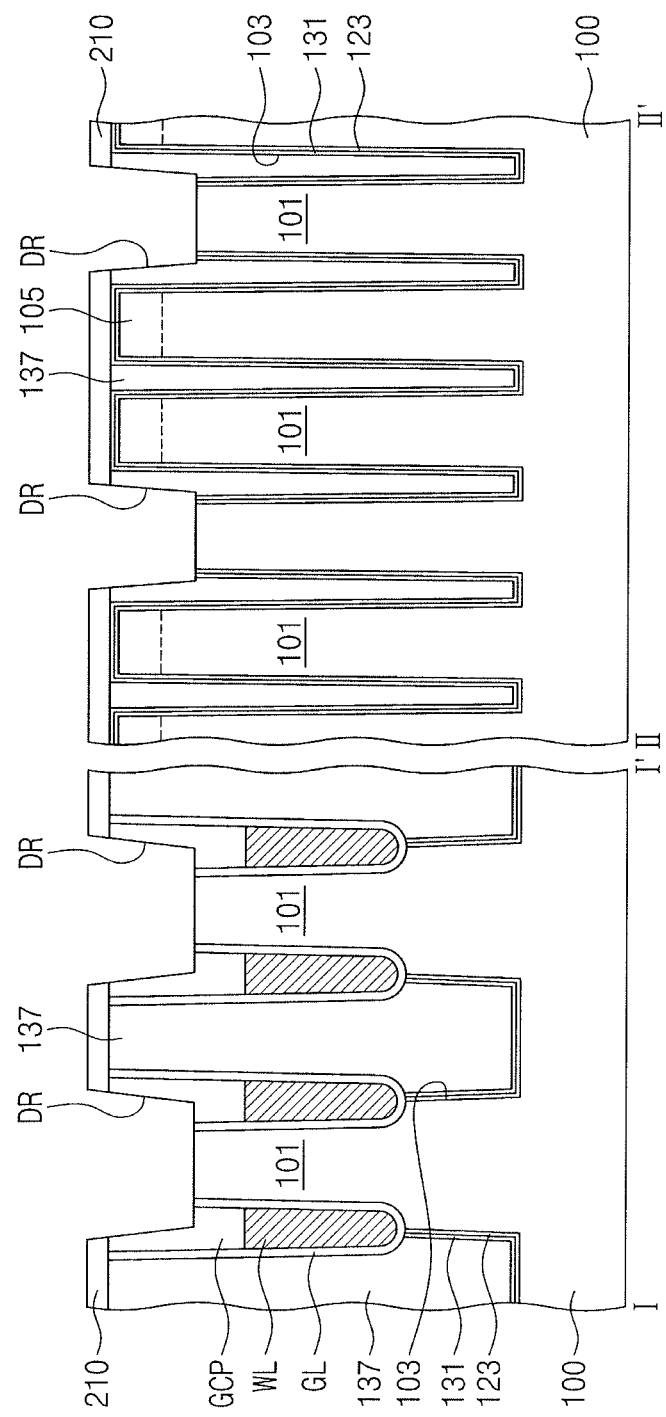

Referring to FIGS. 5 and 6E, an interlayer dielectric layer 210 may be formed on an entire surface of the semiconductor substrate 100. The interlayer dielectric layer 210 may include a single dielectric layer or a plurality of dielectric layers. The interlayer dielectric layer 210 may include, e.g., one or more of a silicon oxide layer, a silicon nitride layer, and a silicon oxynitride layer.

The semiconductor substrate 100 and the interlayer dielectric layer 210 may be patterned to form contact recess regions DR, each of which exposes a central portion of the active region 101. In an implementation, each of the contact recess regions DR may have an oval shape that has a major axis in the second direction D2. When viewed in plan, the contact recess regions DR may be arranged in a zigzag or honeycomb shape.

When an anisotropic etching process is performed to form the contact recess regions DR, the anisotropic etching process may also etch the device isolation structure adjacent to the central portion of each active region 101 and portions of the gate hardmask patterns GCP.

The anisotropic etching process to form the contact recess regions DR may partially etch the polycrystalline silicon layer 123 and the silicon oxide layer 131, and the contact recess region DR may partially expose the buried dielectric pattern 137 and the gate hardmask pattern GCP.

Figure 6F:
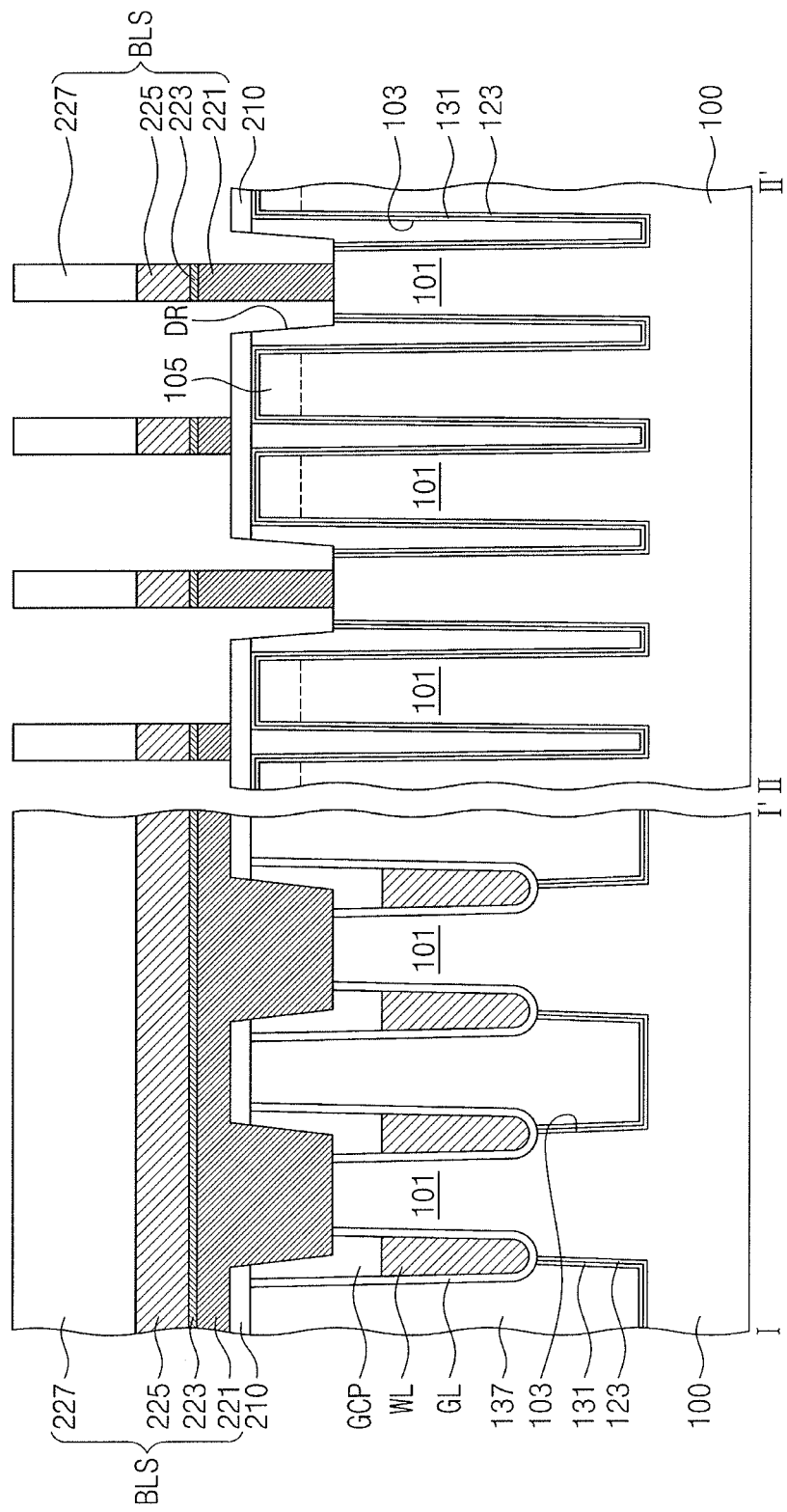

Referring to FIGS. 5 and 6F, bit line structures BLS extending in the second direction D2 may be formed on the interlayer dielectric layer 210 having the contact recess regions DR.

The formation of the bit line structures BLS may include forming a first conductive layer on the interlayer dielectric layer 210 to fill the contact recess regions DR, forming a second conductive layer on the first conductive layer, forming a hardmask layer on the second conductive layer, forming a bit line mask pattern on the hardmask layer, and using the bit line mask pattern to sequentially etch the first conductive layer, the second conductive layer, and the hardmask layer. Thereafter, the bit line mask pattern may be removed.

The bit line structure BLS formed as discussed above may include a polysilicon pattern 221, a silicide pattern 223, a metal pattern 225, and a hardmask pattern 227 that are sequentially stacked. A portion of the polysilicon pattern 221 may be locally formed in the contact recess regions DR, and the portion of the polysilicon pattern 221 may constitute a bit line contact pattern DC in direct contact with the source/drain impurity region 105. The polysilicon pattern 221 may have sidewalls spaced apart from those of the contact recess regions DR.

Figure 6G:
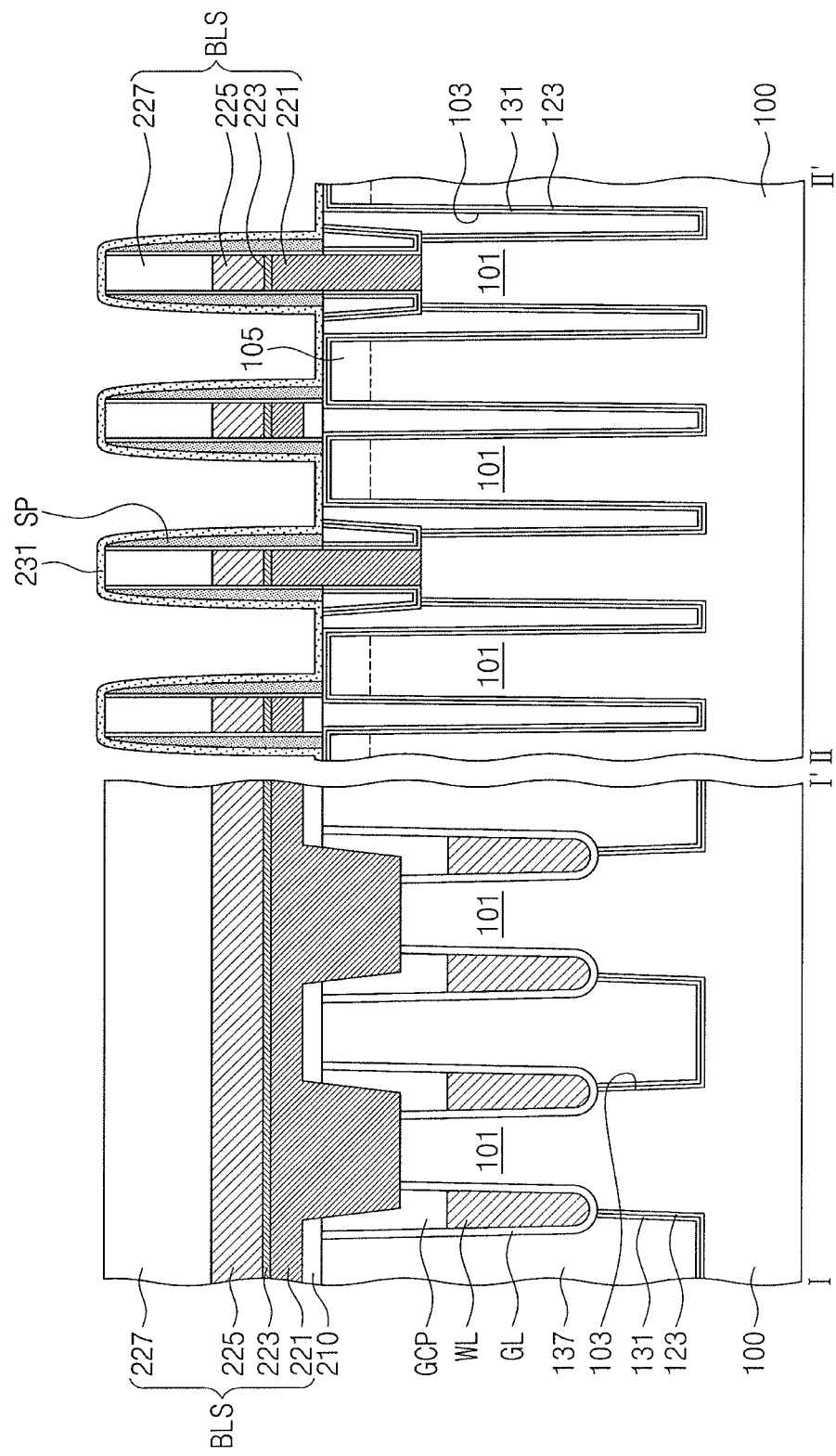

Referring to FIGS. 5 and 6G, bit line spacers SP may be formed on sidewalls of the bit line structures BLS. Portions of the bit line spacers SP may fill the contact recess regions DR on opposite sides of the bit line structure BLS.

The formation of the bit line spacers SP may include depositing a spacer layer that fills the contact recess regions DR and conformally covers the bit line structures BLS, and anisotropically etching the spacer layer. The spacer layer may include a first nitride layer, an oxide layer, and a second nitride layer that are sequentially stacked.

After the bit line spacers SP are formed, an etch stop layer 231 may be formed to conformally cover the bit line structures BLS, the bit line spacers SP, and the interlayer dielectric layer 210. The etch stop layer 231 may be formed of a dielectric material having an etch selectivity with respect to the bit line spacers SP and the interlayer dielectric layer 210.

Dielectric patterns may be formed on the word lines WL between the bit line structures BLS. The dielectric patterns may be spaced apart from each other in the second direction D2 between the bit line structures BLS.

Figure 6H:
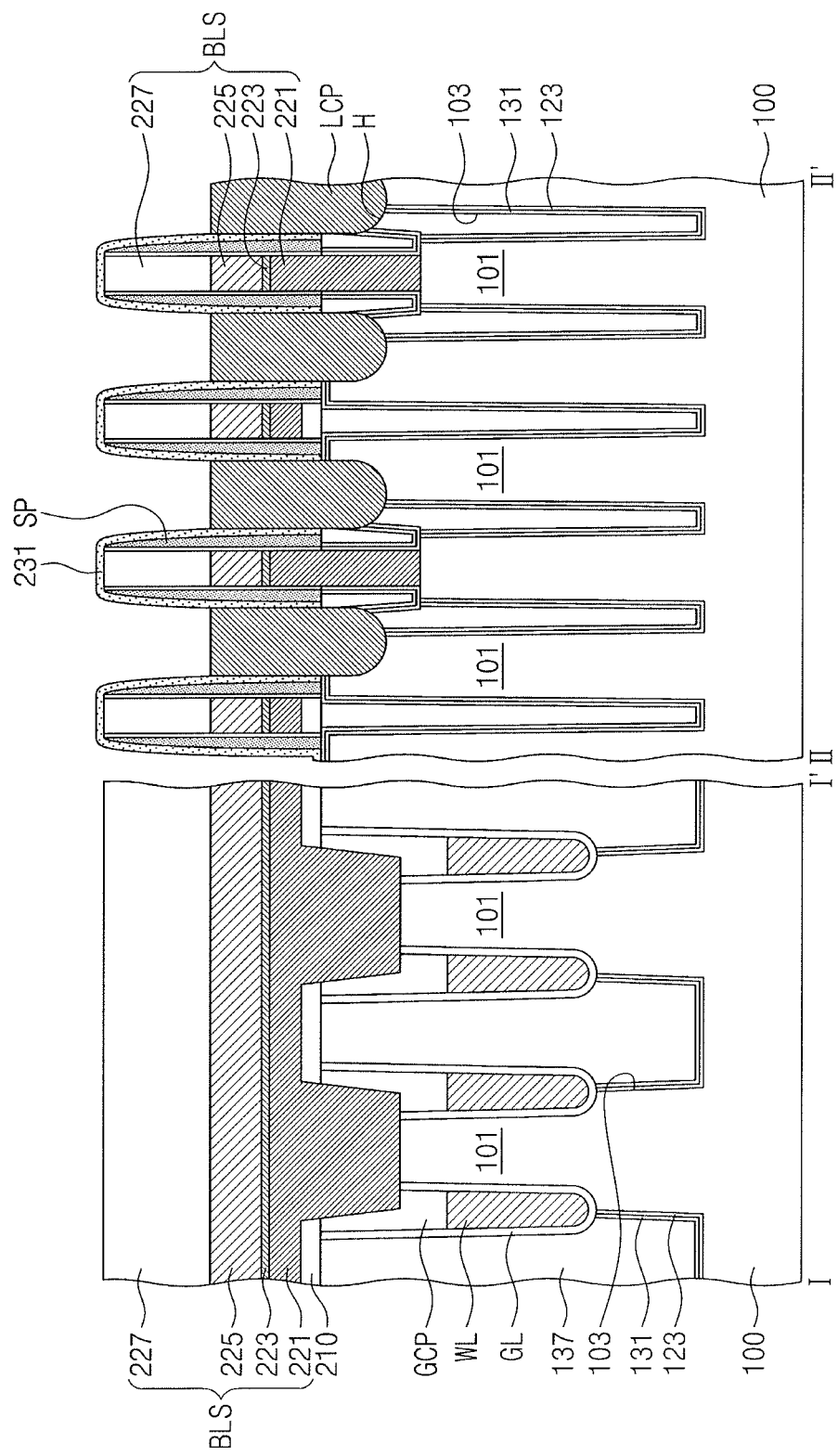

Referring to FIGS. 5 and 6H, contact holes H may be formed to locally (e.g., partially) expose portions of the active regions 101 between the bit line structures BLS. When viewed in plan, the contact holes H may be defined by the bit line structures BLS and the dielectric patterns. The contact holes H may be formed by partially etching the etch stop layer 231, the interlayer dielectric layer 210, the semiconductor substrate 100, and the device isolation structure.

The contact holes H may have bottom surfaces lower than the top surface of the semiconductor substrate 100, and may partially expose the bit line spacers SP in the contact recess regions DR.

Lower contact patterns LCP may be formed to fill the contact holes H. The lower contact patterns LCP may contact the source/drain impurity regions 105 on opposite sides of the bit line structure BLS. The lower contact patterns LCP may have their top surfaces lower than those of the hardmask patterns 227 of the bit line structures BLS and higher than that of the semiconductor substrate 100.

The formation of the lower contact patterns LCP may include depositing a conductive layer to fill the contact holes H, planarizing the conductive layer to expose the bit line structures BLS and the dielectric patterns, and recessing a top surface of the conductive layer. Because the lower contact patterns LCP are formed as described above, an upper portion of the bit line spacer SP may be exposed to the contact hole H.

Figure 6I:
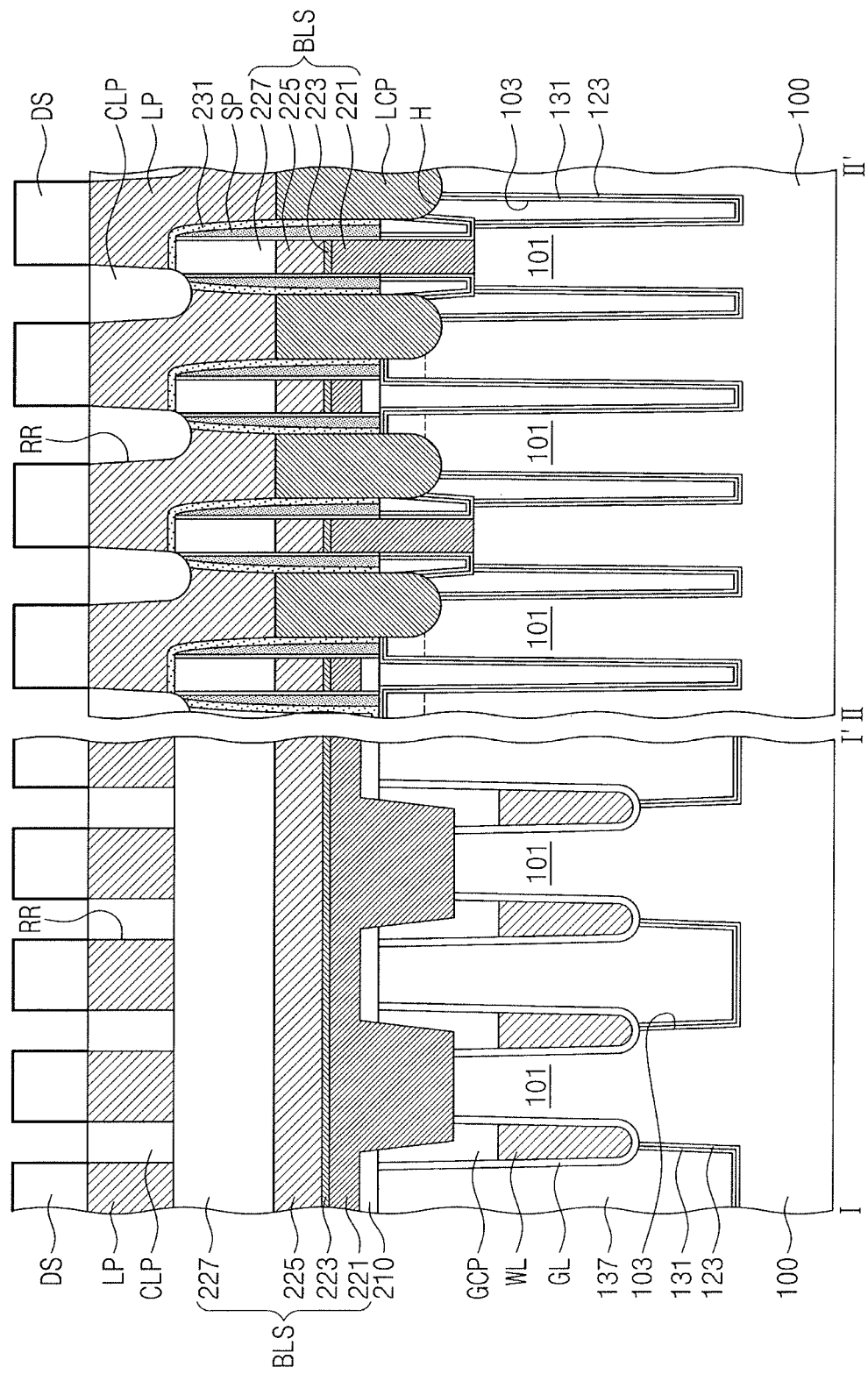

Referring to FIGS. 5 and 6I, after the lower contact patterns LCP are formed, landing pads LP may be formed to have connection with corresponding lower contact patterns LCP.

The formation of the landing pads LP may include conformally depositing a barrier metal layer on the entire surface of the semiconductor substrate 100, forming on the barrier metal layer a metal layer to fill the contact holes H, forming mask patterns on the metal layer, and using the mask patterns as an etching mask to sequentially etch the metal layer and the barrier metal layer to form a pad recess region RR. The landing pads LP may completely fill the contact holes H and fully cover the bit line structures BLS.

The pad recess region RR may have a bottom surface lower than top surfaces of the bit lines structures BLS, and the landing pads LP may then be separated in the first and second directions D1 and D2. While the pad recess region RR is formed, the etch stop layer 231 and the hardmask pattern 227 may be partially etched.

Each of the landing pads LP may include a lower segment that fills a lower portion of the contact hole H and an upper segment that extends towards top ends of the bit line structures BLS. The upper segment of the landing pad LP may have an oval shape when viewed in plan, and the oval-shaped landing pad LP may have a major axis in an oblique direction relative to the first and second directions D1 and D2. Further, metal silicide patterns may be formed between the landing pads LP and the lower contact patterns LCP.

After the pad recess region RR is formed, a capping dielectric pattern CLP may be formed to fill the pad recess region RR. The formation of the capping dielectric pattern CLP may include forming a capping dielectric layer to fill the pad recess region RR, and then performing a planarization process to expose a top surface of the landing pad LP.

Data storage elements DS may be formed on corresponding landing pads LP. The data storage element DS may be provided in various shapes. For example, the data storage element DS may be achieved as a capacitor, a variable resistor, or the like.

In an implementation, when a capacitor is adopted as the data storage element DS, the capacitor may include a bottom electrode, a capacitor dielectric layer, and a top electrode. In an implementation, when a variable resistor is provided as the data storage element DS, the variable resistor may include a variable resistance material that can be changed into a plurality of stable states that have different resistivities from each other. In an implementation, the variable resistor may be a magnetic tunnel junction pattern, a phase change material pattern, or a material pattern that can generate and annihilate filaments.

Figure 7:
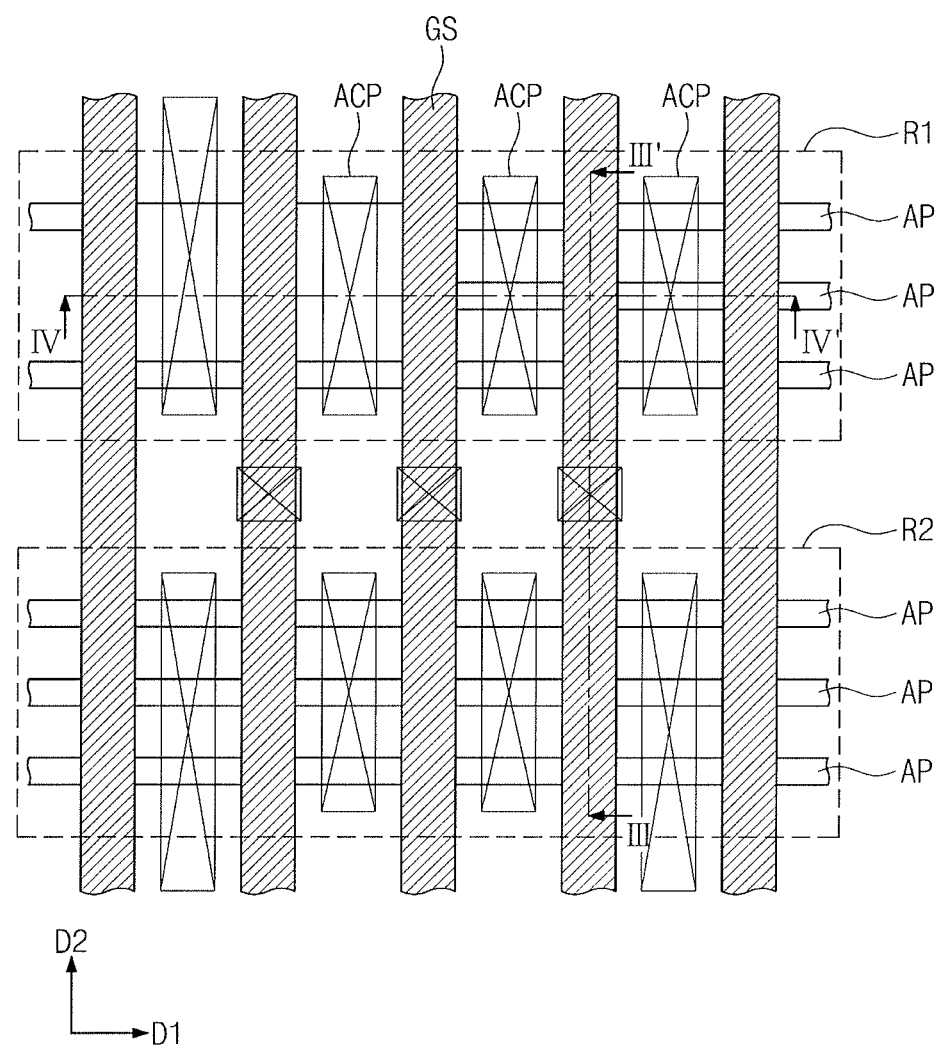
FIG. 7 illustrates a plan view of a semiconductor device according to some example embodiments.

FIG. 7 illustrates a plan view of a semiconductor device according to some example embodiments. FIGS. 8A to 8E illustrate cross sectional views taken along line III-III' of FIG. 7, of stages in a method of fabricating a semiconductor device according to some example embodiments. FIG. 9 illustrates a cross-sectional view taken along line IV-IV' of FIG. 7. For brevity of description, omissions may be made to avoid repetitive explanation of the same technical feature as that of the method of forming a thin layer of a semiconductor device, discussed with reference to FIGS. 1 and 2A to 2F.

Figure 8A:
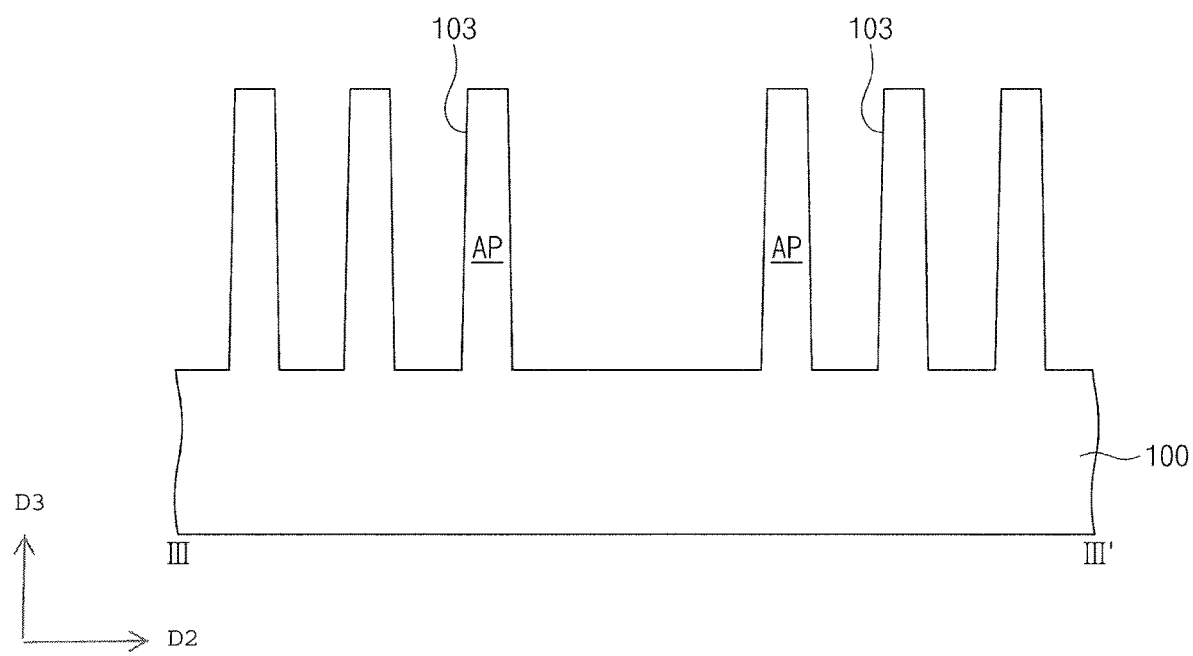
FIGS. 8A to 8E illustrate cross sectional views taken along line III-III' of FIG. 7, of stages in a method of fabricating a semiconductor device according to some example embodiments.
Figure 9:
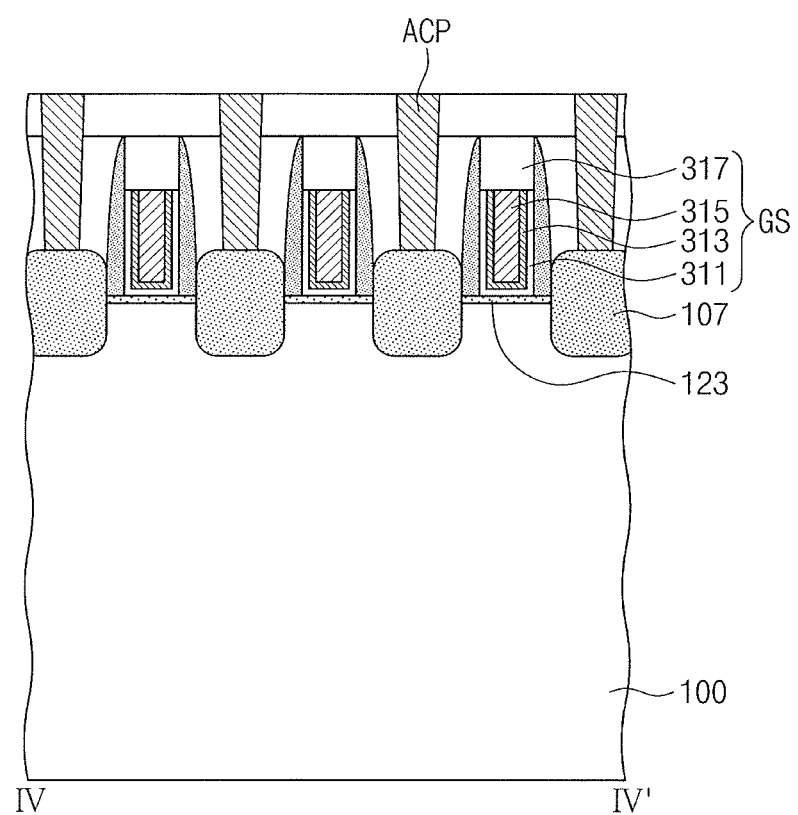
FIG. 9 illustrates a cross-sectional view taken along line IV-IV' of FIG. 7.

Referring to FIGS. 7 and 8A, a semiconductor substrate 100 may include first and second well regions R1 and R2. In an implementation, NMOS field effect transistors may be provided on the first well region R1, and PMOS field effect transistors may be provided on the second well region R2.

The semiconductor substrate 100 may be, e.g., a single crystalline silicon substrate, a germanium substrate, a silicon-on-insulator (SOI) substrate, or a germanium-on-insulator (GOI) substrate.

The semiconductor substrate 100 may be patterned to form trenches 103. The active patterns AP may be portions of the semiconductor substrate 100, and may be defined by the trenches 103 formed in the semiconductor substrate 100. On each of the first and second well regions R1 and R2, a plurality of active patterns AP may extend in the first direction D1 and may be spaced apart from each other in the second direction D2 intersecting the first direction D1.

Figure 8B:
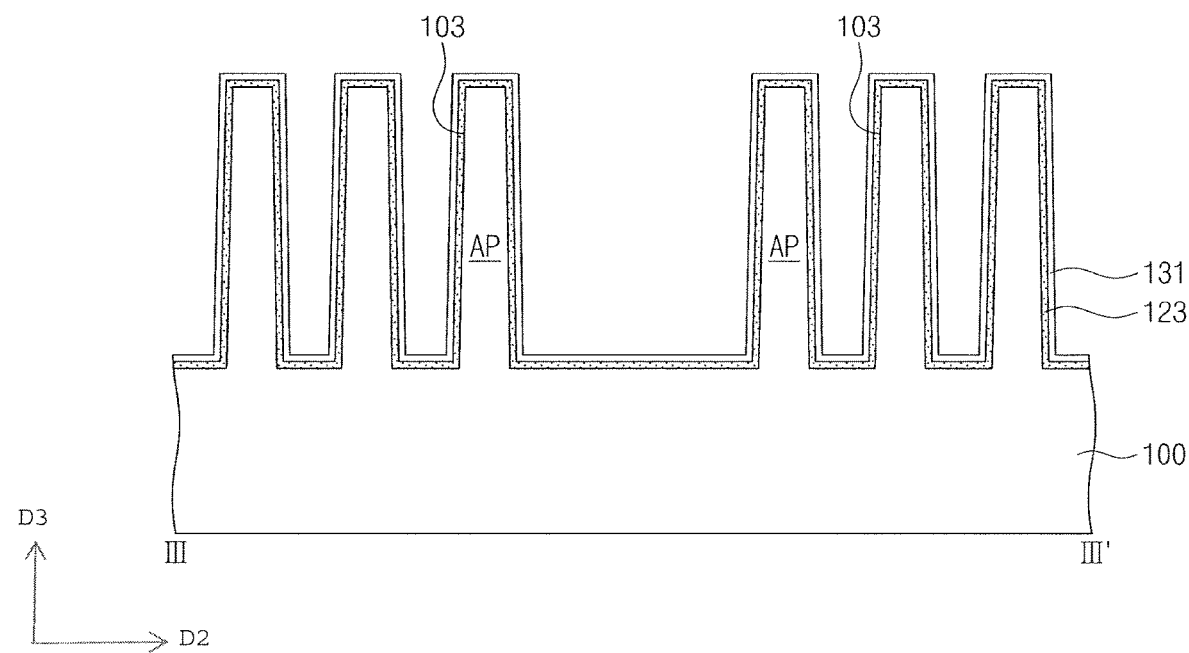

Referring to FIGS. 7 and 8B, as discussed above, a polycrystalline silicon layer 123 and a silicon oxide layer 131 may be sequentially formed on a surface of the semiconductor substrate 100 in which the trenches 103 are formed. The semiconductor substrate 100 and the polycrystalline silicon layer 123 may have an interface therebetween at which single crystalline silicon is in contact with polycrystalline silicon. The polycrystalline silicon layer 123 and the silicon oxide layer 131 may have an interface therebetween at which polycrystalline silicon is in contact with silicon oxide.

Figure 8C:
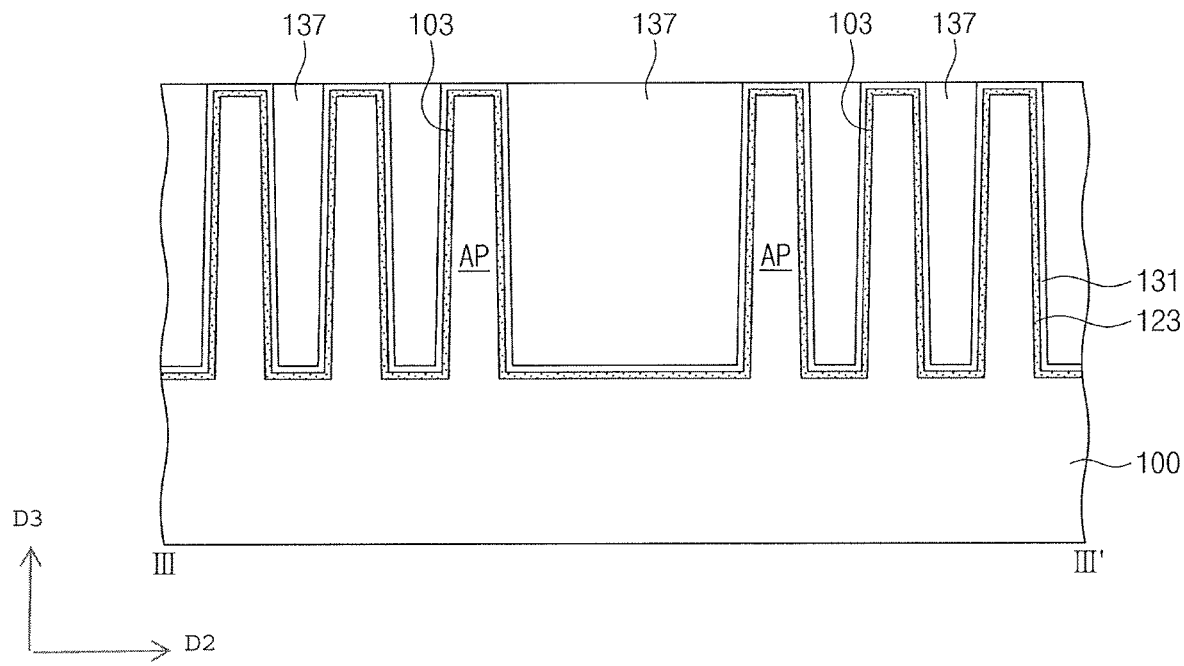

Referring to FIGS. 7 and 8C, buried dielectric patterns 137 may be formed to fill (e.g., remaining parts of) the trenches 103 in which the polycrystalline silicon layer 123 and the silicon oxide layer 131 have been formed. The buried dielectric patterns 137 may be formed by forming a buried dielectric layer to fill the trenches 103 and then performing a planarization process to expose the polycrystalline silicon layer 123 or the silicon oxide layer 131. The active patterns AP may separate the buried dielectric patterns 137 from each other.

Figure 8D:
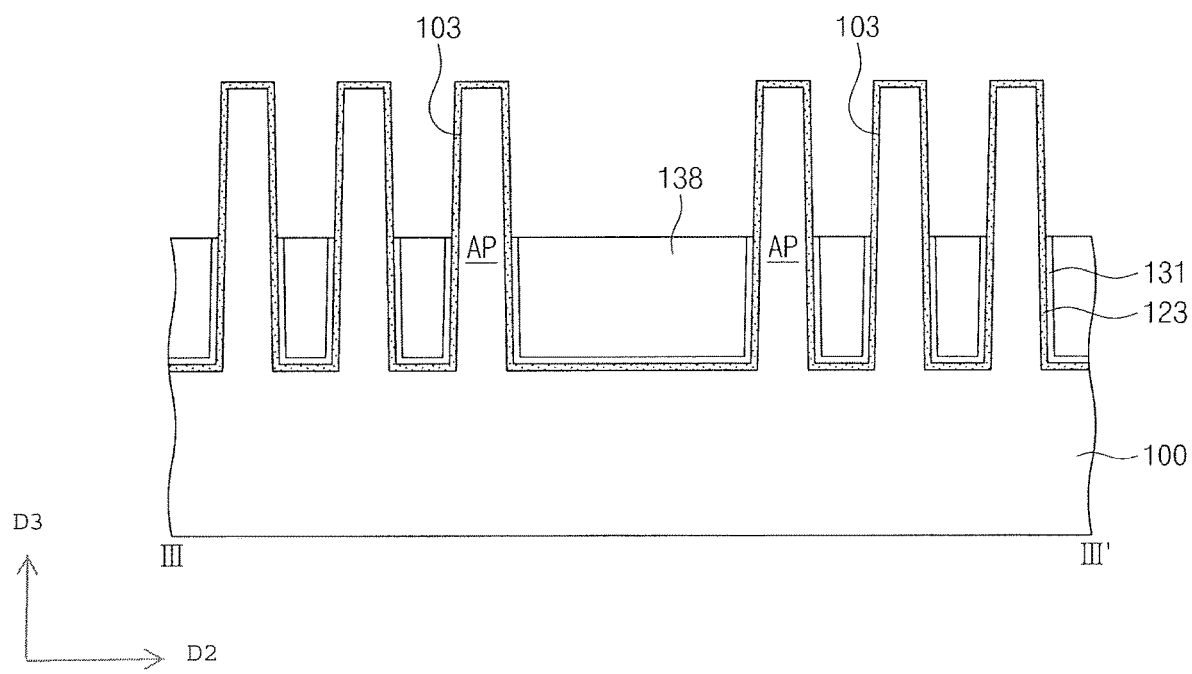

Referring to FIGS. 7 and 8D, top surfaces of the buried dielectric patterns 137 may be recessed to expose upper portions of the active patterns AP. For example, device isolation patterns 138 may be formed to fill lower portions of the trenches 103. The formation of the device isolation patterns 138 may include performing an etching process whose etching recipe has an etch selectivity with respect to the active patterns AP and the polycrystalline silicon layer 123.

In an implementation, while the etching process is performed to form the device isolation patterns 138, a portion of the silicon oxide layer 131 may also be etched and the polycrystalline silicon layer 123 may be exposed on the upper portions of the active patterns AP. In an implementation, while the etching process is performed to form the device isolation patterns 138, a portion of the polycrystalline silicon layer 123 may also be etched to expose the upper portions of the active patterns AP. In an implementation, the polycrystalline silicon layer 123 may remain on portions of sidewalls of the active patterns AP and on bottom surfaces of the trenches 103.

Figure 8E:
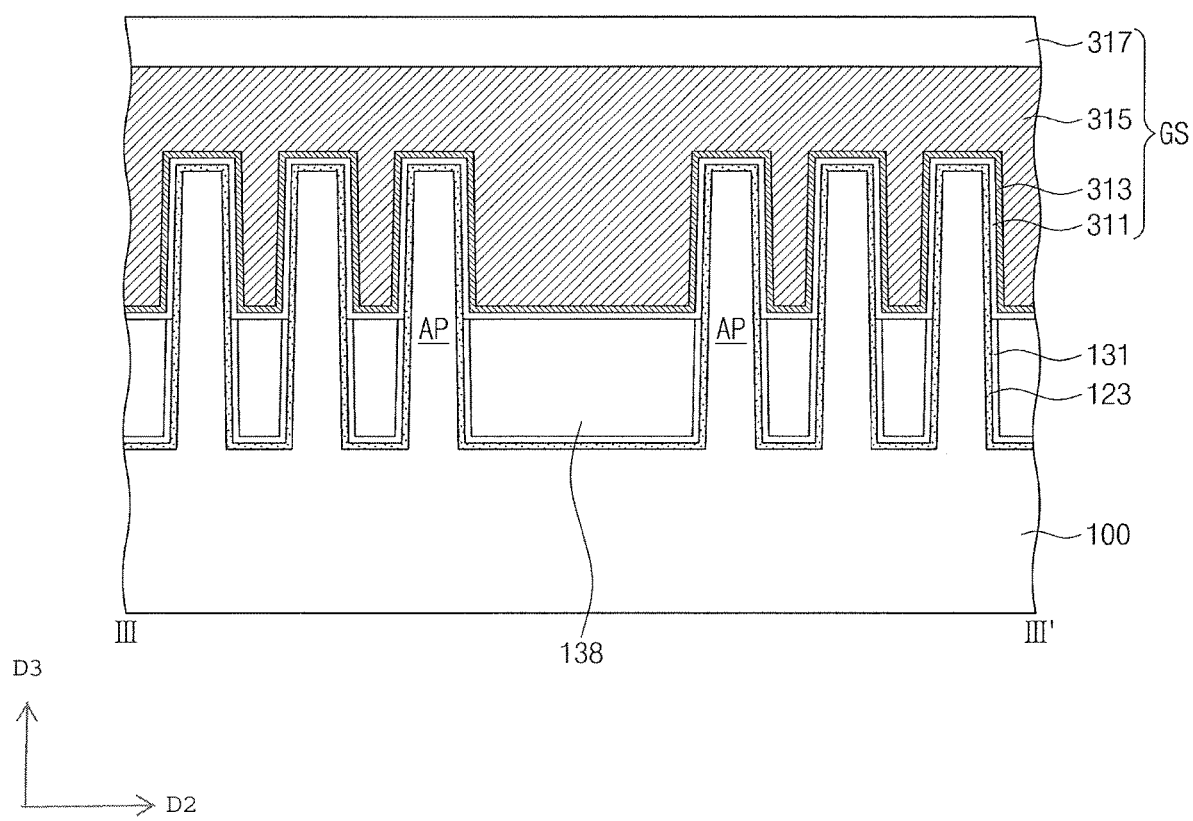

Referring to FIGS. 7 and 8E, gate structures GS may be formed to run across the active patterns AP. The gate structures GS may extend in the second direction D2 and may run across the active patterns AP on the first and second well regions R1 and R2. The gate structures GS may have substantially the same width (e.g., in the first direction D1) and may be spaced apart in the first direction D1 from each other at a regular interval.

Each of the gate structures GS may include a gate dielectric layer 311, a gate barrier metal pattern 313, a gate metal pattern 315, and a capping dielectric pattern 317. Gate spacers may be on opposite sidewalls of each of the gate structures GS. The gate barrier metal pattern 313 may be between the gate dielectric layer 311 and the gate metal pattern 315, and may extend between the gate metal pattern 315 and the gate spacers.

The gate dielectric layer 311 may conformally cover the active patterns AP. The gate dielectric layer 311 may include a silicon oxide layer or a high-k dielectric layer. In an implementation, the gate dielectric layer 311 may directly contact the polycrystalline silicon layer 123 that covers the upper portions of the active patterns AP. In an implementation, the gate dielectric layer 311 may directly contact the upper portions of the active patterns AP.

Referring to FIGS. 7 and 9, after that gate structures GS are formed, source/drain impurity layers 107 may be formed on the active pattern AP on opposite sides of the gate structure GS.

The source/drain impurity layers 107 may be epitaxial layers that are formed by epitaxial growth from the active patterns AP. The source/drain impurity layers 107 may be, e.g., germanium (Ge) epitaxial layers on the first well region R1 and silicon carbide (SiC) epitaxial layers on the second well region R2. The source/drain impurity layers 107 may include, e.g., n-type impurities on the first well region R1 and p-type impurities on the second well region R2.

In an implementation, silicon grains may be uniformly distributed at an interface between the polycrystalline silicon layer 123 and the silicon oxide layer 131, and it may be possible to improve characteristics of the interface between the polycrystalline silicon layer 123 and the silicon oxide layer 131. For example, when transistors are operated, a leakage current may be prevented from occurring at the interface between the polycrystalline silicon layer 123 and the silicon oxide layer 131. As a result, a semiconductor device may help improve in electrical characteristics and reliability.

Figure 10:
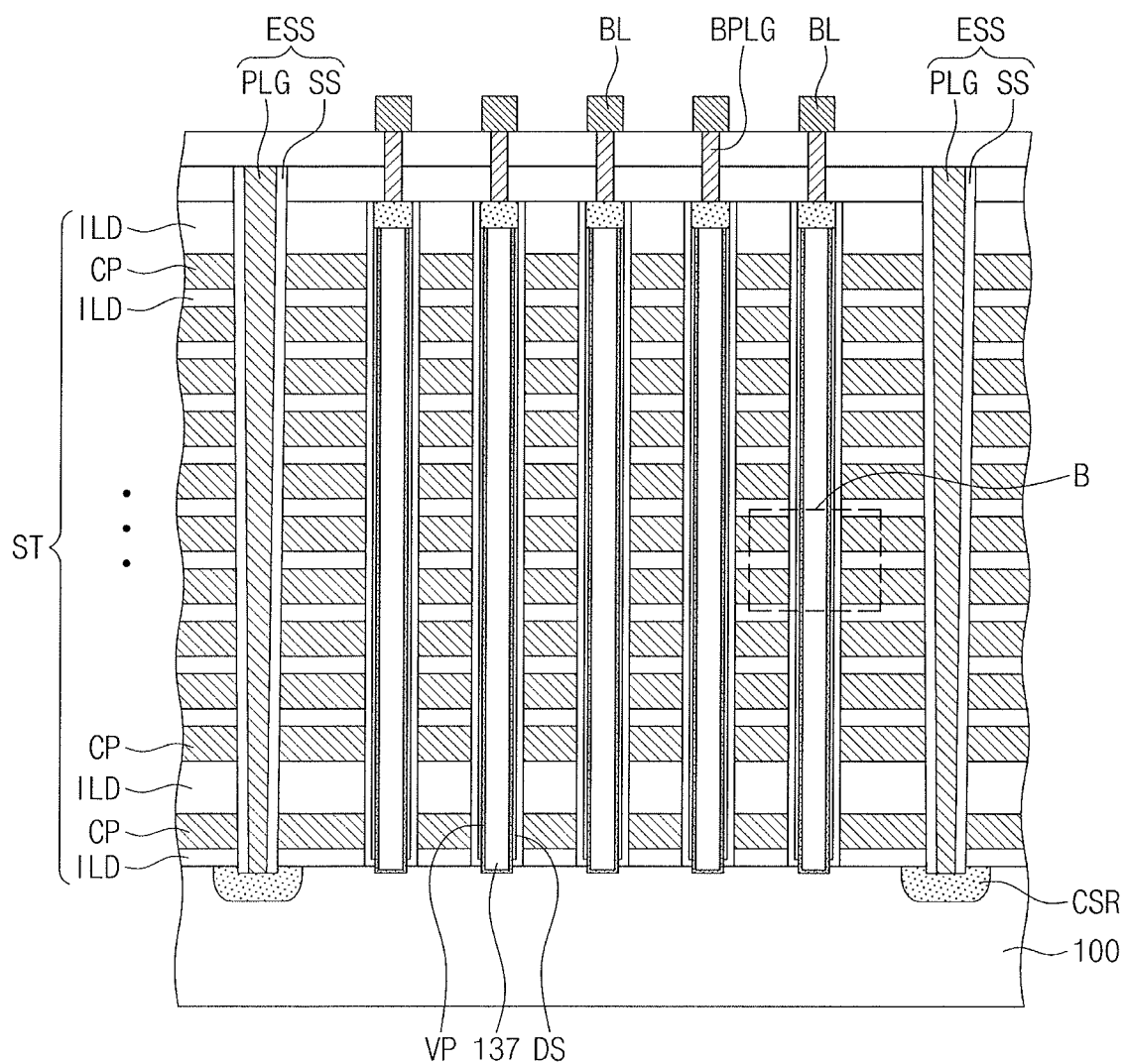
FIG. 10 illustrates a cross-sectional view of a semiconductor device according to some example embodiments.
Figure 11:
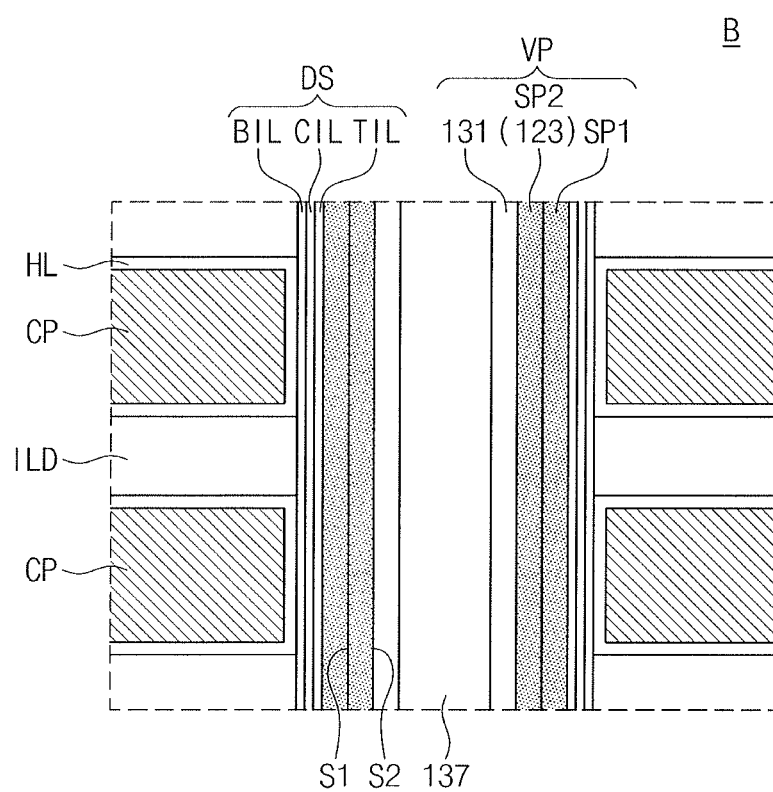
FIG. 11 illustrates an enlarged view showing section B of FIG. 10.

FIG. 10 illustrates a cross-sectional view of a semiconductor device according to some example embodiments. FIG. 11 illustrates an enlarged view showing section B of FIG. 10.

Referring to FIG. 10, an electrode structure ST may be on a semiconductor substrate 100. The semiconductor substrate 100 may be one of a semiconductor material (e.g., silicon wafer), a dielectric material (e.g., glass), and a semiconductor or conductor covered with a dielectric material. In an implementation, the semiconductor substrate 100 may be a silicon wafer having a first conductivity type.

Common source regions CSR may be in the semiconductor substrate 100, and the common source regions CSR may be formed by implanting the first-conductivity-type semiconductor substrate 100 with second conductivity type impurities, or n-type impurities such as arsenic (As) or phosphorus (P). The common source regions CSR may extend in a first direction D1 parallel to the electrode structures ST and may be spaced apart from each other in a second direction D2. In an implementation, each of the electrode structure ST may be disposed between neighboring common source regions CSR.

The electrode structure ST may be on the semiconductor substrate 100 between the common source regions CSR. The electrode structure ST may include dielectric patterns ILD and conductive patterns CP that are vertically and alternately stacked on the semiconductor substrate 100. The electrode structure ST may extend in a direction parallel to a top surface of the semiconductor substrate 100. The electrode structure ST may be between electrode separation structures ESS that are spaced apart from each other. The electrode separation structure ESS may include a common source plug PLG connected to the common source region CSR and also include a dielectric spacer SS between the common source plug PLG and sidewalls of the electrode structure ST.

Vertical semiconductor patterns VP may penetrate the electrode structure ST and have connection with the semiconductor substrate 100. In an implementation, the vertical semiconductor patterns VP may extend in a direction perpendicular to the top surface of the semiconductor substrate 100. Each of the vertical semiconductor patterns VP may have a conductive pad on a top thereof, and the conductive pad may be an impurity-doped region or formed of a conductive material.

A data storage pattern DS may be between the electrode structure ST and the vertical semiconductor patterns VP. The data storage pattern DS may surround a sidewall of the vertical semiconductor pattern VP.

Referring to FIG. 11, the vertical semiconductor pattern VP may include a first semiconductor pattern SP1, a second semiconductor pattern SP2, and a silicon oxide layer 131.

The first semiconductor pattern SP1 may be adjacent to the data storage pattern DS, and may have a macaroni shape or a pipe (e.g., hollow cylindrical) shape whose top and bottom ends are opened. In an implementation, the first semiconductor pattern SP may be a polycrystalline silicon layer 123.

The second semiconductor pattern SP2 may have a macaroni shape or a hollow pipe shape whose bottom end is closed. The second semiconductor pattern SP2 may have an inside filled with a buried dielectric pattern 137. The second semiconductor pattern SP2 may be in contact with an inner wall of the first semiconductor pattern SP1 and with the top surface of the semiconductor substrate 100. In this configuration, the second semiconductor pattern SP2 may electrically connect the first semiconductor pattern SP1 to the semiconductor substrate 100. The first and second semiconductor patterns SP1 and SP2 may be either undoped or doped with impurities whose conductivity type is the same as that of the semiconductor substrate 100.

As described previously with reference to FIGS. 2A to 2F, the second semiconductor pattern SP2 may be the polycrystalline silicon layer 123 that is formed by depositing and crystallizing an amorphous silicon layer.

The silicon oxide layer 131 may be between the second semiconductor pattern SP2 and the buried dielectric pattern 137. The silicon oxide layer 131 on the second semiconductor pattern SP2 may be formed by performing an oxidation process on a surface of the second semiconductor pattern SP2. For example, a uniform interface may be formed between the second semiconductor pattern SP2 and the silicon oxide layer 131. In an implementation, silicon grains may be uniformly distributed at the interface between the second semiconductor pattern SP2 and the silicon oxide layer 131, and when current flows through the first and second semiconductor patterns SP1 and SP2, a current leakage may be prevented at the interface between the second semiconductor pattern SP2 and the silicon oxide layer 131.

The data storage pattern DS may include a charge storage layer that stores data in a NAND Flash memory device. For example, as illustrated in FIG. 11, the data storage pattern DS may include a tunnel dielectric layer TIL, a charge storage layer CIL, and a blocking dielectric layer BIL. The charge storage layer CIL may be one of a dielectric layer with abundant trap sites and a dielectric layer with nanoparticles. In an implementation, the charge storage layer CIL may include one of a trap dielectric layer, a floating gate electrode, and a dielectric layer including conductive nanodots. A horizontal dielectric layer HL may be disposed between the data storage pattern DS and sidewalls of the conductive patterns CP, and the horizontal dielectric layer HL may cover top and bottom surfaces of each conductive pattern CP.

Figure 12:
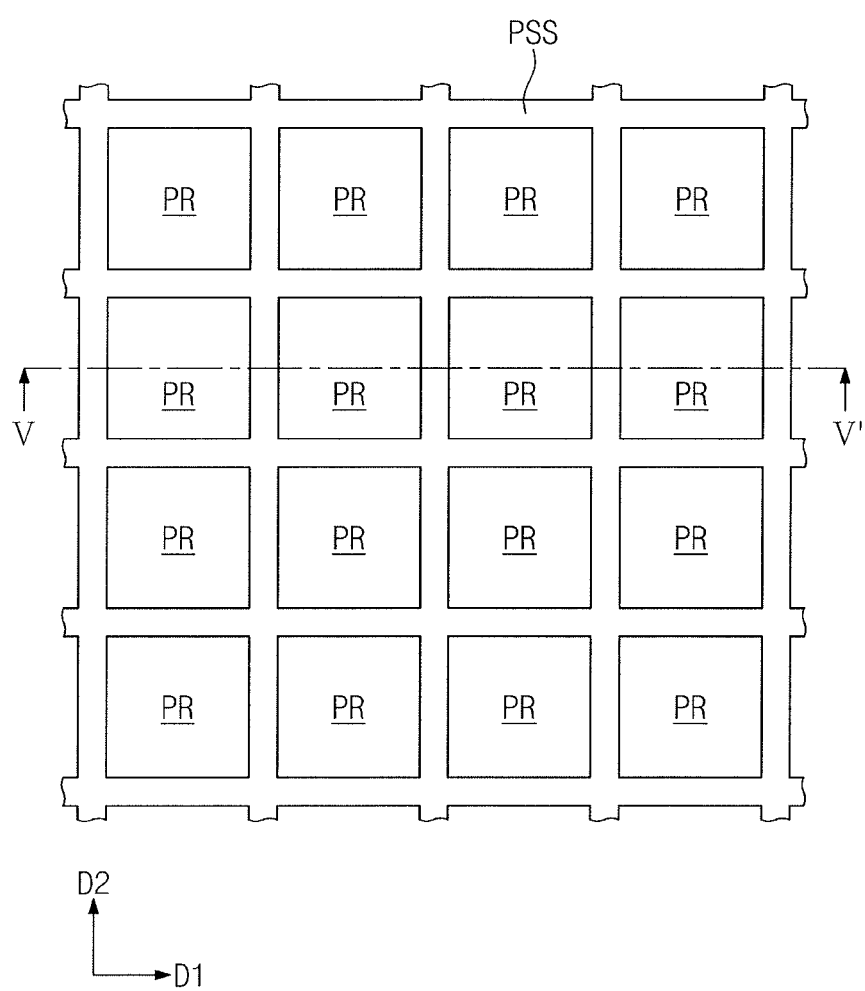
FIG. 12 illustrates a plan view of a semiconductor device according to some example embodiments.
Figure 13:
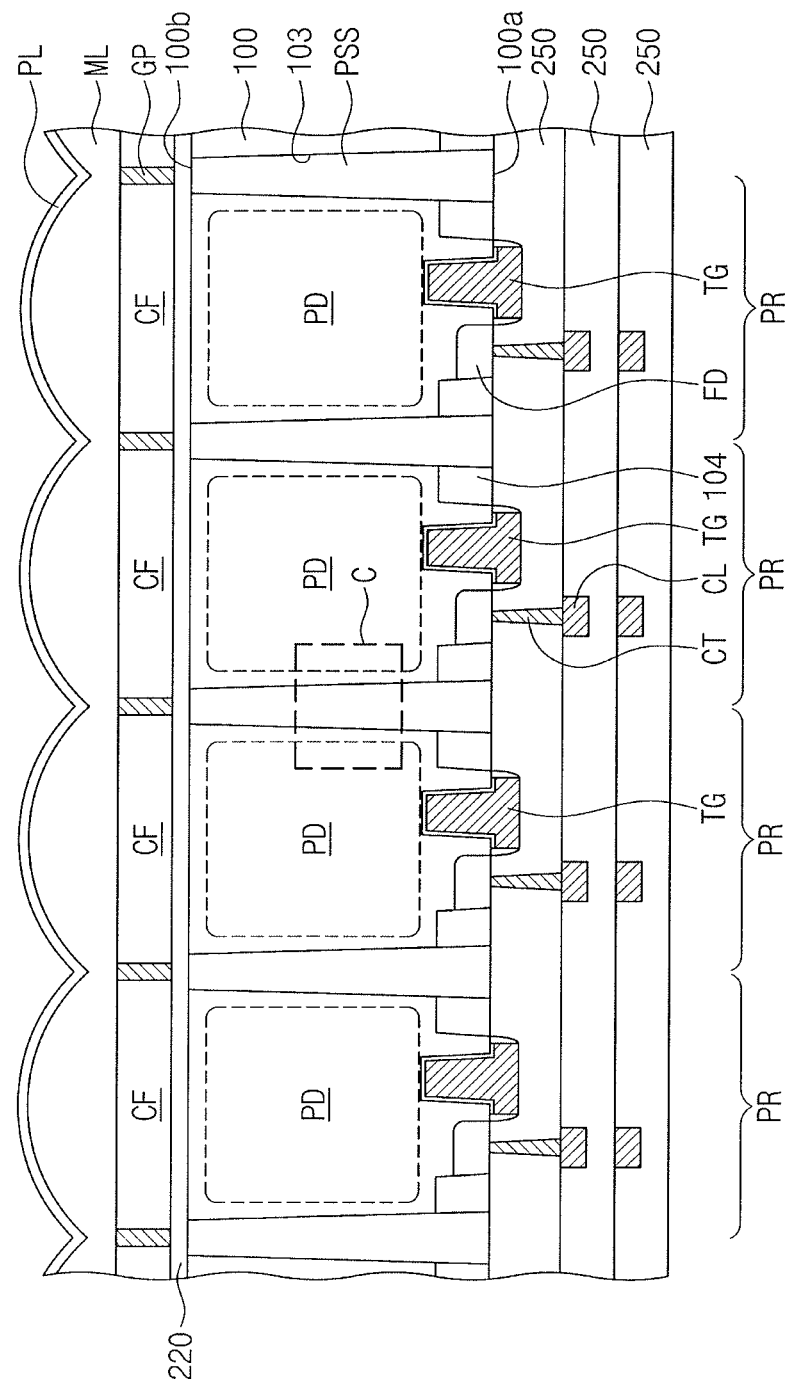
FIG. 13 illustrates a cross-sectional view taken along line V-V' of FIG. 12.
Figure 14:
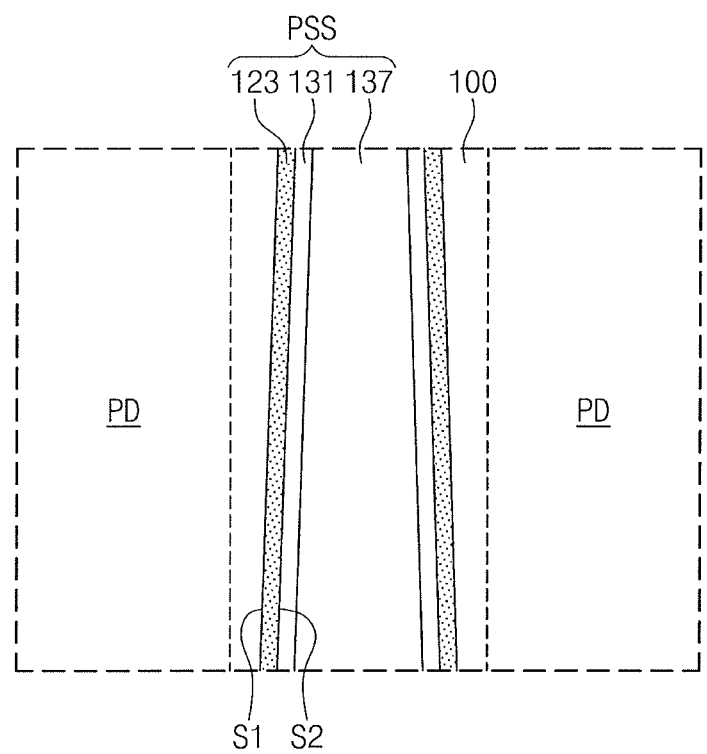
FIG. 14 illustrates an enlarged view showing section C of FIG. 13.

FIG. 12 illustrates a plan view of a semiconductor device according to some example embodiments. FIG. 13 illustrates a cross-sectional view taken along line V-V' of FIG. 12. FIG. 14 illustrates an enlarged view showing section C of FIG. 13.

Referring to FIGS. 12 and 13, a semiconductor substrate 100 may have a first surface 100a and a second surface 100b that face each other. In an implementation, the semiconductor substrate 100 may be configured such that an epitaxial layer is formed on a bulk silicon substrate having the same first conductivity type (e.g., p-type) as that of the epitaxial layer. In an implementation, the semiconductor substrate 100 may be a p-type epitaxial layer that remains after a bulk silicon substrate is removed in a fabrication process for an image sensor. In an implementation, the semiconductor substrate 100 may be a bulk semiconductor substrate that includes a well having a first conductivity type.

The semiconductor substrate 100 may include a plurality of pixel regions PR defined by a pixel separation structure PSS. The plurality of pixel regions PR may be arranged in a matrix shape along first and second directions D1 and D2 that intersect each other.

The pixel separation structure PSS may vertically extend from the first surface 100a toward the second surface 100b of the semiconductor substrate 100. The pixel separation structure PSS may penetrate the semiconductor substrate 100. In an implementation, the pixel separation structure PSS may have a vertical thickness substantially the same as that of the semiconductor substrate 100. In other embodiments, the pixel separation structure PSS may vertically extend from the first surface 100a toward but short of the second surface 100b of the semiconductor substrate 100.

The pixel separation structure PSS may have a first width adjacent to the first surface 100a of the semiconductor substrate 100 and a second width, which is greater than the first width, adjacent to the second surface 100b of the semiconductor substrate 100. In an implementation, the pixel separation structure PSS may have a width that gradually decreases approaching the first surface 100a from the second surface 100b of the semiconductor substrate 100. In an implementation, the pixel separation structure PSS may have a uniform width and penetrate the semiconductor substrate 100.

When viewed in plan, the pixel separation structure PSS may surround each of the pixel regions PR. For example, the pixel separation structure PSS may include first segments that extend in parallel to each other along the first direction D1 and are spaced apart from each other in the second direction D2 and also include second segments that extend in parallel to each other along the second direction D2 and are spaced apart from each other in the first direction D1.

The pixel separation structure PSS may be formed of a dielectric material whose refractive index is less than that of the semiconductor substrate 100 (e.g., silicon), and may include a single dielectric layer or a plurality of dielectric layers. In an implementation, the pixel separation structure PSS may be formed of silicon oxide, silicon nitride, undoped polysilicon, air, or a combination thereof. The pixel separation structure PSS may help prevent cross-talk between neighboring pixel regions PR.

Referring to FIGS. 13 and 14, the pixel separation structure PSS may include a buried dielectric pattern 137, a silicon oxide layer 131, and a polycrystalline silicon layer 123 in contact with an inner wall of a trench 103 of the semiconductor substrate 100. As discussed above, the polycrystalline silicon layer 123 of the pixel separation structure PSS may be formed by depositing and crystallizing an amorphous silicon layer on a surface of the trench 103 that defines the pixel regions PR. The silicon oxide layer 131 of the pixel separation structure PSS may be formed by oxidizing a surface of the polycrystalline silicon layer 123. For example, a uniform interface may be formed between the polycrystalline silicon layer 123 and the silicon oxide layer 131.

Photoelectric conversion regions PD may be provided on corresponding pixel regions PR. The photoelectric conversion regions PD may be formed by implanting the semiconductor substrate 100 with impurities having a second conductivity type opposite to a first conductivity type of the semiconductor substrate 100. A photodiode may be formed at a junction between the semiconductor substrate 100 having the first conductivity type and the photoelectric conversion region PD having the second conductivity type. The photoelectric conversion regions PD may generate photo-charges in proportion to magnitude of an incident light.

On each of the pixel regions PR, a device isolation layer 104 may be disposed adjacent to the first surface 100a of the semiconductor substrate 100. The device isolation layer 104 may define an active region 101 of the semiconductor substrate 100.

When viewed in plan, a transfer gate electrode TG may be positioned on a central portion of each pixel region PR. A portion of the transfer gate electrode TG may be disposed within the semiconductor substrate 100, and a gate dielectric layer may be interposed between the transfer gate electrode TG and the semiconductor substrate 100. A floating diffusion region FD may be provided in the semiconductor substrate 100 on one side of the transfer gate electrode TG. The floating diffusion region FD may be formed by implanting the semiconductor substrate 100 with impurities whose conductivity type is opposite to that of semiconductor substrate 100. In an implementation, the floating diffusion region FD may be an n-type impurity region.

Interlayer dielectric layers 250 may be stacked on the first surface 100a of the semiconductor substrate 100, and the interlayer dielectric layers 250 may cover the transfer gate electrode TG and MOS transistors that constitute read-out circuits.

Color filters CF and micro-lenses ML may be disposed on the second surface 100b of the semiconductor substrate 100. A buffer dielectric layer 220 may be disposed between the color filters CF and the second surface 100b of the semiconductor substrate 100.

The buffer dielectric layer 220 may include either a metal oxide layer including oxygen whose amount is less than its stoichiometric ratio or a metal fluoride layer including fluorine whose amount is less than its stoichiometric ratio. For example, the buffer dielectric layer 220 may have a negative fixed charge.

The color filters CF and the micro-lenses ML may be disposed to correspond to the pixel regions PR. The color filter CF may include one of red, green, and blue filters depending on a unit pixel. The color filters CF may be arranged two-dimensionally, and may include a yellow filter, a magenta filter, and a cyan filter. In addition, the color filters CF may further include one or more white filters.

Each of the micro-lenses ML may have a convex shape with a certain radius of curvature. The micro-lenses ML may be formed of a light-transmissive resin and may condense an incident light onto pixel regions PR. A passivation layer PL may be conformally cover top surfaces of the micro-lenses ML. The passivation layer PL may be formed of, e.g., inorganic oxide.

By way of summation and review, high speed operation may be difficult to achieve because reduction in critical dimension (CD) increases resistance of wiring lines and capacitance between wiring lines. Various options have been considered to manufacture the semiconductor device having superior performances while overcoming limitations due to high integration of the semiconductor device.

According to a semiconductor device and a method of fabricating the same in accordance with some example embodiments, a polycrystalline silicon layer and a silicon oxide layer may have an interface therebetween with enhanced properties, and a current leakage may be prevented at the interface between the polycrystalline silicon layer and the silicon oxide layer. As a result, the semiconductor device may exhibit improved electrical characteristics and reliability.

One or more embodiments may provide a semiconductor device with improved electrical characteristics and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a semiconductor substrate that includes a trench defining an active region;
a buried dielectric pattern in the trench;
a silicon oxide layer between the buried dielectric pattern and an inner wall of the trench; and
a polycrystalline silicon layer between the silicon oxide layer and the inner wall of the trench,
wherein the polycrystalline silicon layer has a first surface in contact with the semiconductor substrate and a second surface in contact with the silicon oxide layer,
wherein the second surface includes a plurality of silicon grains that are uniformly distributed, and
wherein the polycrystalline silicon layer is prepared by:
performing a deposition process at a first temperature range to form an amorphous silicon layer on a surface of the semiconductor substrate including directly on inner walls of the trench; and
performing a rapid thermal annealing process on the amorphous silicon layer at a second temperature range while providing $H_2O$, $O_2$, $O_3$, or oxygen radicals on a surface of the amorphous silicon layer to form the polycrystalline silicon layer, the second temperature range being different from the first temperature range.

2. The device as claimed in claim 1, wherein a surface roughness of the second surface is substantially the same as a surface roughness of the first surface.

3. The device as claimed in claim 1, wherein the second surface has a surface roughness of 0.1 Å to 10 Å.

4. The device as claimed in claim 1, wherein:
the semiconductor substrate includes a single crystalline silicon substrate, and
the polycrystalline silicon layer is in direct contact with the single crystalline silicon substrate.

5. The device as claimed in claim 1, wherein the silicon oxide layer is thicker than the polycrystalline silicon layer when measured in a same direction.

6. The device as claimed in claim 1, further comprising a discontinuous native oxide layer that is locally positioned between the semiconductor substrate and the first surface of the polycrystalline silicon layer.

7. The device as claimed in claim 1, wherein a width of the active region is less than a width of the trench.

8. The device as claimed in claim 1, wherein:
the polycrystalline silicon layer extends along a sidewall of the trench toward a top surface of the semiconductor substrate, and
the polycrystalline silicon layer has a first thickness on the sidewall of the trench and a second thickness on the top surface of the semiconductor substrate, the second thickness being different from the first thickness.

9. A semiconductor device, comprising:
a semiconductor substrate that includes a trench defining an active region;
a buried dielectric pattern in the trench;
a silicon oxide layer between the buried dielectric pattern and an inner wall of the trench;
a polycrystalline silicon layer between the silicon oxide layer and the inner wall of the trench;
a conductive line that is in the semiconductor substrate and runs across the active region;
a gate dielectric layer between the semiconductor substrate and the conductive line; and
a plurality of impurity regions in the active region on opposite sides of the conductive line,
wherein the polycrystalline silicon layer has a first surface in contact with the silicon oxide layer, and
wherein the first surface includes a plurality of silicon grains that are uniformly distributed, and
wherein the polycrystalline silicon layer is prepared by:
performing a deposition process at a first temperature range to form an amorphous silicon layer on a surface of the semiconductor substrate including directly on inner walls of the trench; and
performing a rapid thermal annealing process on the amorphous silicon layer at a second temperature range while providing $H_2O$, $O_2$, $O_3$, or oxygen radicals on a surface of the amorphous silicon layer to form the polycrystalline silicon layer, the second temperature range being different from the first temperature range.

10. The device as claimed in claim 9, wherein the polycrystalline silicon layer is in contact with a bottom surface of the trench and a portion of a lateral surface of the trench.

11. The device as claimed in claim 9, wherein:
the semiconductor substrate includes a single crystalline silicon substrate, and
the polycrystalline silicon layer is in direct contact with the single crystalline silicon substrate.

12. The device as claimed in claim 9, wherein the gate dielectric layer is in contact with a portion of the polycrystalline silicon layer and a portion of the silicon oxide layer.

13. The device as claimed in claim 9, wherein the first surface of the polycrystalline silicon layer has a surface roughness of 0.1 Å to 10 Å.

14. The device as claimed in claim 9, wherein the silicon oxide layer is thicker than the polycrystalline silicon layer when measured in a same direction.

15. The device as claimed in claim 9, wherein a width of the active region is less than a width of the trench.

\* \* \* \* \*